United States Patent
Kodama et al.

(10) Patent No.: US 6,700,175 B1
(45) Date of Patent: Mar. 2, 2004

(54) VERTICAL SEMICONDUCTOR DEVICE HAVING ALTERNATING CONDUCTIVITY SEMICONDUCTOR REGIONS

(75) Inventors: Masahito Kodama, Aichi (JP); Tsutomu Uesugi, Aichi (JP)

(73) Assignee: Kabushiki Kaisha Toyota Chuo Kenkyusho, Aichi-gun (JP)

(*) Notice: Subject to any disclaimer, the term of this patent is extended or adjusted under 35 U.S.C. 154(b) by 0 days.

(21) Appl. No.: 10/019,567

(22) PCT Filed: Jun. 28, 2000

(86) PCT No.: PCT/JP00/04224
§ 371 (c)(1),
(2), (4) Date: Dec. 31, 2001

(87) PCT Pub. No.: WO01/03202
PCT Pub. Date: Jan. 11, 2001

(30) Foreign Application Priority Data

Jul. 2, 1999 (JP) .............................. 11-189142

(51) Int. Cl.[7] ...................... H01L 23/58; H01L 21/8242
(52) U.S. Cl. ................... 257/489; 257/302; 257/328; 257/329; 257/339; 438/259; 438/246; 438/270
(58) Field of Search ........................ 257/303, 329, 257/339, 328, 351, 487; 438/242–248, 259, 270

(56) References Cited

U.S. PATENT DOCUMENTS

| | | | | |
|---|---|---|---|---|
| 3,982,269 A | * | 9/1976 | Torreno et al. ............. | 257/500 |
| 4,686,552 A | * | 8/1987 | Teng et al. ................. | 257/68 |
| 5,216,275 A | * | 6/1993 | Chen ........................... | 257/493 |
| 5,438,215 A | | 8/1995 | Tihanyi ....................... | 257/401 |
| 5,466,348 A | * | 11/1995 | Holm-Kennedy ........... | 205/775 |
| 5,538,564 A | * | 7/1996 | Kaschmitter ................ | 136/255 |
| 5,828,101 A | * | 10/1998 | Endo ........................... | 257/330 |
| 5,905,296 A | * | 5/1999 | Tuttle .......................... | 257/356 |
| 6,072,215 A | * | 6/2000 | Kawaji et al. .............. | 257/334 |
| 6,103,578 A | * | 8/2000 | Uenishi et al. ............. | 438/268 |
| 6,201,279 B1 | * | 3/2001 | Pfirsch ........................ | 257/333 |
| 6,337,499 B1 | * | 1/2002 | Werner ........................ | 257/329 |
| 6,638,814 B1 | * | 10/2003 | Kieslich et al. ............. | 438/246 |
| 2002/0038886 A1 | * | 4/2002 | Mo .............................. | 257/330 |

FOREIGN PATENT DOCUMENTS

| | | |
|---|---|---|
| JP | 54-108661 | 1/1978 |
| JP | 2000-40822 | 2/2000 |
| JP | 2000-133801 | 5/2000 |
| JP | 2000-208527 | 7/2000 |

* cited by examiner

Primary Examiner—Amir Zarabian
Assistant Examiner—Ida M. Soward
(74) Attorney, Agent, or Firm—Oblon, Spivak, McClelland, Maier & Neustadt, P.C.

(57) ABSTRACT

There is provided a method of manufacturing a vertical semiconductor device including a structural section in which an n⁻-type semiconductor region and a p⁻-type semiconductor region are arranged alternately without filling trenches by epitaxial growth. A p⁻-type silicon layer (13) which becomes a p⁻-type semiconductor region (12) is formed. An n⁻-type semiconductor region (11) is formed by diffusing n-type impurities into the p⁻-type silicon layer (13) through the sidewalls of first trenches (22) formed in the p⁻-type silicon layer (13).

28 Claims, 17 Drawing Sheets

VERTICAL SEMICONDUCTOR DEVICE HAVING ALTERNATING CONDUCTIVITY SEMICONDUCTOR REGIONS

TECHNICAL FIELD

The present invention relates to a high voltage semiconductor device. More particularly, the present invention relates to a vertical semiconductor device and a method of manufacturing the same.

BACKGROUND OF ART

FIG. 34 is a cross-sectional view showing a high voltage MOSFET disclosed in U.S. Pat. No. 5,216,275. The structure of this high voltage MOSFET 300 is described below. The high voltage MOSFET 300 is a vertical MOSFET. The high voltage MOSFET 300 is formed on a semiconductor substrate. The semiconductor substrate includes an n$^+$-type drain region 304. p-type semiconductor regions 302 and n-type semiconductor regions 301 are formed on the drain region 304, arranged alternately p$^+$-type semiconductor regions 303 are formed on the p-type semiconductor regions 302. The end sections of the p$^+$-type semiconductor regions 303 are located on the n-type semiconductor regions 301. A gate electrode 309 is formed on the n-type semiconductor region 301 and the sidewalls of the p$^+$-type semiconductor regions 303 through a gate insulating film 308. A pair of n$^+$-type source regions 305 is formed on the surfaces of the p$^+$-type semiconductor regions 303 with an interval therebetween. Source electrodes 310 are formed on the p$^+$-type semiconductor regions 303 between the n$^+$-type source regions 305.

The operation of the high voltage MOSFET 300 is described below. The operation in the case where the high voltage MOSFET 300 is in an ON state is described first. When a positive voltage is applied to the gate electrode 309, channel regions are formed in the p$^+$-type semiconductor regions 303 in regions facing the gate insulating film 308. Electrons are supplied from the source regions 305 and reach the drain region 304 through the channel regions and the n-type semiconductor region 301. In this case, the ON voltage of the high voltage MOSFET 300 is mainly determined by a voltage drop by the resistance of the n-type semiconductor region 301.

The operation in the case where the high voltage MOSFET 300 is in an OFF state is described below. Either 0 V or a negative voltage is applied to the gate electrode 309. This causes the channel regions to disappear. In the case where the drain voltage is about 10 V, depletion layer is formed and spread along junctions formed between the n-type semiconductor region (drain region 304 and n-type semiconductor region 301 make up the n-type semiconductor region) and the p-type semiconductor regions (p-type semiconductor regions 302 and p$^+$-type semiconductor regions 303 make up the p-type semiconductor regions). The widths of the n-type semiconductor region 301 and the p-type semiconductor region 302 are small. Therefore, the n-type semiconductor region 301 and the p-type semiconductor regions 302 are depleted completely as the drain voltage increases. Specifically, the breakdown voltage is sustained by the structural section in which the n-type semiconductor regions 301 and the p-type semiconductor regions 302 are arranged alternately.

The above U.S. Patent describes the high voltage MOSFET having the structural section in which the n-type semiconductor regions 301 and the p-type semiconductor regions 302 are arranged alternately as a device with a high breakdown voltage and a low ON voltage.

The method of forming the p-type semiconductor regions 302 and the n-type semiconductor regions 301 of the high voltage MOSFET 300 shown in FIG. 34 is described below. An n-type (or p-type) epitaxial layer is epitaxially grown on the semiconductor substrate which becomes the drain region 304. The n-type (or p-type) epitaxial layer is selectively removed, thereby forming trenches which reach the drain region 304. The remaining n-type (or p-type) epitaxial layer becomes the n-type semiconductor regions 301 (or p-type semiconductor regions 302). The trenches are filled with the p-type semiconductor regions 302 (or n-type semiconductor regions 301) by epitaxial growth.

As described above, the structural section in which the p-type semiconductor regions 302 and the n-type semiconductor regions 301 are arranged alternately is fabricated by forming the trenches by selectively removing the semiconductor layer of first conductive type and filling the trenches with the semiconductor layers of second conductive type by epitaxial growth. The epitaxial growth step is generally a high temperature process. Therefore, in the case of fabricating the structural section in which the p-type semiconductor regions and the n-type semiconductor regions are arranged alternately using the above method, phenomena may occur in which impurities in the semiconductor layers of second conductive type are diffused into the semiconductor layers of first conductive type and impurities in the semiconductor layers of first conductive type are diffused into the semiconductor layers of second conductive type during the formation of the semiconductor layers of second conductive type. Therefore, it is difficult to miniaturize the structural section in which the p-type semiconductor regions and the n-type semiconductor regions are formed, arranged alternately.

DISCLOSURE OF INVENTION

The present invention has been attained to solve the above problems. An objective of the present invention is to provide a vertical semiconductor device including a structural section in which a first semiconductor region of first conductive type and a second semiconductor region of second conductive type are arranged alternately without filling trenches by epitaxial growth, and a method of manufacturing the same.

The present invention relates to a vertical semiconductor device including a structural section in which a first semiconductor region of first conductive type and a second semiconductor region of second conductive type are arranged alternately, wherein a breakdown voltage is sustained by the structural section, wherein a graded junction is formed between the first semiconductor region and the second semiconductor region, and wherein an impurity profile of first conductive type in the graded junction is graded along a direction in which the first and second semiconductor regions are arranged alternately.

According to the vertical semiconductor device of the present invention, since the distribution of the impurities of first conductive type is graded in the first semiconductor region, depletion layer can be spread widely in a region in which the concentration of the impurities of first conductive type is lower. Therefore, the first semiconductor region and the second semiconductor region can be easily depleted even if the widths of these regions are comparatively greater, whereby an increase in the breakdown voltage can be realized.

The vertical semiconductor device including the above structural section has a high breakdown voltage and a low ON voltage. The reasons there for are described below taking a high voltage vertical MOS field effect transistor as an example. The breakdown voltage is an important parameter which determines the performance of the transistor. In the case where a section corresponding to the structural section formed of only the first semiconductor region of first conductive type, the breakdown voltage is determined by the junction breakdown voltage at the junction between the first semiconductor region and a second conductive type body region (channel is formed in body region). The junction breakdown voltage increases as the impurity concentration in the first semiconductor region decreases. This is because the length of the depletion layer increases as the impurity concentration decreases. The length of the depletion layer refers to the length of the depletion layer in a source-drain direction. However, the resistance of the first semiconductor region increases as the impurity concentration decreases. This causes the ON voltage of the transistor to be increased. In the transistor having such a structure, since the impurity concentration in the first semiconductor region is determined by the breakdown voltage, it is difficult to decrease the ON voltage in the case of a high voltage transistor.

In the case of a transistor having the above structural section, the depletion layer is spread from the junction between the first semiconductor region and the second semiconductor region toward the first semiconductor region and the second semiconductor region. Therefore, the structural section can be depleted completely even if the impurity concentration in the first semiconductor region is increased. Specifically, the breakdown voltage can be increased while decreasing the ON voltage.

As examples of the vertical semiconductor device according to the present invention, MOS field effect transistors can be given. A UMOS and VMOS are given as such MOS field effect transistors.

The vertical semiconductor device according to the present invention may have the following feature:
The distribution of the impurities of first conductive type in the graded junction decreases toward a junction between the first semiconductor region and the second semiconductor region.

When a voltage is applied to the junction (pn junction, for example), the electric field strength generally reaches a maximum at the junction. The lower the impurity concentration, the lower the electric field strength at the same applied voltage. Therefore, the junction breakdown voltage increases. According to this feature, the junction breakdown voltage at the junction can be increased.

The vertical semiconductor device according to the present invention may have the following feature:
A trench is formed in the first semiconductor region, and the distribution of the impurities of first conductive type increases from the junction toward the trench.

According to this feature, the resistance of the first semiconductor region decreases near the trench. Therefore, a large amount of current can be caused to flow through the first semiconductor region near the trench. Moreover, in the case of forming a buried electrode in the trench, current can be quickly cut off.

The vertical semiconductor device according to the present invention may have the following feature:
The vertical semiconductor device comprises a semiconductor layer of second conductive type, another trench, and a buried gate electrode,
the other trench is located in the semiconductor layer,
the other trench is located over the trench, and
the buried gate electrode is located in the other trench.

The vertical semiconductor device according to the present invention may have the following feature:
The buried gate electrode extends to the trench.

According to this vertical semiconductor device, since an accumulation layer can be formed in the first semiconductor region near the trench, the ON voltage can be further decreased. The accumulation layer refers to a layer containing a large number of first conductive type carriers formed in the first conductive type semiconductor region by the gate effects of a MIS structure. Since the resistance of the accumulation layer is smaller than that of the first semiconductor region, the ON voltage can be decreased.

The vertical semiconductor device according to the present invention may have the following feature:
The vertical semiconductor device comprise a planar gate electrode.

The vertical semiconductor device according to the present invention may have the following feature:
The graded junction comprise a one-sided abrupt junction.

The vertical semiconductor device according to the present invention may have the following feature:
A width of the other trench is substantially uniform.

The vertical semiconductor device according to the present invention may have the following feature:
A width of the other trench becomes smaller towards a direction of a bottom thereof.

The vertical semiconductor device according to the present invention may have the following feature:
The vertical semiconductor device comprise a third semiconductor region of first conductive type which becomes a drain and a fourth semiconductor region of first conductive type which becomes a source, and
the structural section is located between the third semiconductor region and the fourth semiconductor region.

The vertical semiconductor device according to the present invention may have the following feature:
The vertical semiconductor device comprise a third semiconductor region of first conductive type which becomes a drain,
the structural section is located over the third semiconductor region, and
the trench reaches the third semiconductor region through the first semiconductor region to remove part of a surface of the third semiconductor region.

According to this vertical semiconductor device, operation reliability of the vertical semiconductor device can be increased.

The present invention further relates to a method of manufacturing a vertical semiconductor device including a structural section in which a first semiconductor region of first conductive type and a second semiconductor region of second conductive type are arranged alternately,
wherein a breakdown voltage is sustained by the structural section, and
wherein the method comprises steps of:
(a) forming a trench in a semiconductor layer of second conductive type; and
(b) diffusing impurities of first conductive type into the semiconductor layer through a sidewall of the trench, then forming the first semiconductor region in part of the semiconductor layer and allowing a remaining portion of the semiconductor layer to become the second semiconductor region.

According to the method of manufacturing a vertical semiconductor device of the present invention, the first semiconductor region is formed by diffusion. Therefore, the first semiconductor region and the second semiconductor region have a graded junction structure. In this graded junction, the distribution of the impurities of first conductive type is graded along a direction in which the first semiconductor region and the second semiconductor region are arranged alternately.

According to the present invention, the first semiconductor region is formed by diffusion. Therefore, the structural section can be miniaturized in comparison with a method of filling the trench with the first semiconductor region by epitaxial growth. As a result, the degree of integration of the vertical semiconductor device can be increased.

The diffusion may be at least either vapor phase diffusion or solid phase diffusion, for example.

The method of manufacturing a vertical semiconductor device according to the present invention may have the following feature:

The method comprises a step of forming the semiconductor layer over a third semiconductor region of first conductive type which becomes a drain, before the step (a), and in the step (a), the trench is formed so as to reach the third semiconductor region through the semiconductor layer to remove part of a surface of the third semiconductor region.

The method of manufacturing a vertical semiconductor device according to the present invention may have the following feature:

The diffusion comprises vapor phase diffusion in the step (b).

According to this method, impurities can be diffused into a small trench with a width of 0.5 $\mu$m or less.

The method of manufacturing a vertical semiconductor device according to the present invention may have the following feature:

The method comprises a step of forming a film containing the impurities in the trench between the step (a) and the step (b), and the impurities are diffused from the film containing the impurities by solid phase diffusion in the step (b).

Since it is easy to control the impurity concentration in the film containing the impurities which becomes a diffusion source, the impurity distribution in the first semiconductor region can be easily controlled.

In the case where the impurities of first conductive type are n to type, a PSG (Phosphorous Silicate Glass) film and phosphorus doped polysilicon (formed of $PH_3+SiH_4$ gas or $PH_3+Si_2H_6$ gas, for example) can be given as examples of the film containing the impurities. In the case where the impurities of first conductive type are p to type, BSG (Boron Silicate Glass) film and boron doped polysilicon (formed of $B_2H_6+SiH_4$ gas or $B_2H_6+Si_2H_6$ gas, for example) can be given as examples of the film containing the impurities.

The method of manufacturing a vertical semiconductor device according to the present invention may have the following feature:

The method comprises a step of forming a thin film on the sidewall of the trench between the step (a) and the step (b), and the impurities are diffused into the semiconductor layer through the thin film in the step (b).

According to this method, diffusion controllability can be increased. The reasons therefor are described below. If the impurities are diffused in a state in which no film is formed on the sidewall of the trench, the impurity concentration in the first semiconductor region is higher near the upper portion of the trench than near the lower portion of the trench. This is because a greater amount of impurities is supplied from the upper portion of the trench than the lower portion of the trench (supply-limited).

In the case where the impurities are diffused through the thin film formed on the sidewall of the trench, the diffusion follows the diffusion limited which is a limited for impurities diffused through the thin film rather than the supply-limited. Therefore, according to this method, the impurity concentration can be made uniform along the sidewall of the trench.

The thickness of the thin film is 5 nm to 50 nm, for example. If the thickness of the thin film is 5 nm or more, it is unnecessary to diffuse the impurities at a low temperature (800° C. or less, for example) that decreases diffusion controllability. If the thickness is 50 nm or less, the impurities can be diffused even if the temperature is extremely high (1000° C. or more., for example). As examples of the thin film, a silicon oxide film can be given.

The method of manufacturing a vertical semiconductor device according to the present invention may have the following feature:

The method comprises a step of forming a planar gate electrode over an upper surface of the semiconductor layer after the step (b).

The method of manufacturing a vertical semiconductor device according to the present invention may have the following feature:

The method comprises, after the step (b):

a step of forming another trench in the semiconductor layer; and a step of forming a buried gate electrode in the other. trench.

The method of manufacturing a vertical semiconductor device according to the present invention may have the following feature:

The method comprises, before the step (a):

a step of forming another trench in the semiconductor layer; and a step of forming a buried gate electrode in the other trench, and the trench is formed through the buried gate electrode in the step (a).

According to this method, the trench can be formed right under the other trench. Therefore, the degree of integration of the vertical semiconductor device can be increased in comparison with a case of forming the trench so as not to overlap with the other trench on a plane. According to this method, the width of the trench is smaller than that of the other trench.

The method of manufacturing a vertical semiconductor device according to the present invention may have the following feature:

The method may comprise a step of forming another trench in the semiconductor layer before the step (a), a width of the other trench becomes smaller towards a direction of a bottom thereof, and the trench is formed from the bottom of the other trench in the step (a).

According to this method, the trench can be formed right under the other trench.

The method of manufacturing a vertical semiconductor device according to the present invention may have the following feature:

The method comprises, before the step (a):
  a step of forming another semiconductor layer of second conductive type over the semiconductor layer; and
  a step of forming another trench in the other semiconductor layer, and
  the trench is continuously formed with the other trench in the step (a).

The method of manufacturing a vertical semiconductor device according to the present invention may have the following feature:
  The method comprises a step of forming a thin film on the sidewall of the trench between the step (a) and the step (b), and
  the impurities are diffused into the semiconductor layer through the thin film in the step (b).

The method of manufacturing a vertical semiconductor device according to the present invention may have the following feature:
  The method comprises a step of forming a film containing. the impurities in the trench and the other trench after the step of forming the thin film, and
  the impurities are diffused from the film containing the impurities by solid phase diffusion in the step (b).

The method of manufacturing a vertical semiconductor device according to the present invention may have the following feature:
  The method comprises, after the step (b):
    a step of removing the thin film;
    a step of forming another thin film including a gate insulating film over the sidewall of the trench and a sidewall of the other trench; and
    a step of forming a buried electrode layer including a gate electrode in the trench and the other trench.

In the vertical semiconductor device manufactured by this method, an accumulation layer can be formed in the first semiconductor region by the buried electrode layer.

The method of manufacturing a vertical semiconductor device according to the present invention may have the following feature:
  The method comprises, after the step (b):
    a step of removing the film containing the impurities and the thin film;
    a step of forming another thin film including a gate insulating film on the sidewall of the trench and a sidewall of the other trench; and
    a step of forming a buried electrode layer including a gate electrode in the trench and the other trench.

The method of manufacturing a vertical semiconductor device according to the present invention may have the following feature:
  The method comprises:
    a step of forming the semiconductor layer over a third semiconductor region of first conductive type which becomes a drain, before the step (a); and
    a step of forming a fourth semiconductor region of first conductive type which becomes a drain in the semiconductor layer, after the step (b).

BEST MODE FOR CARRYING OUT THE INVENTION

First Embodiment

Description of Structure

Figure 1:
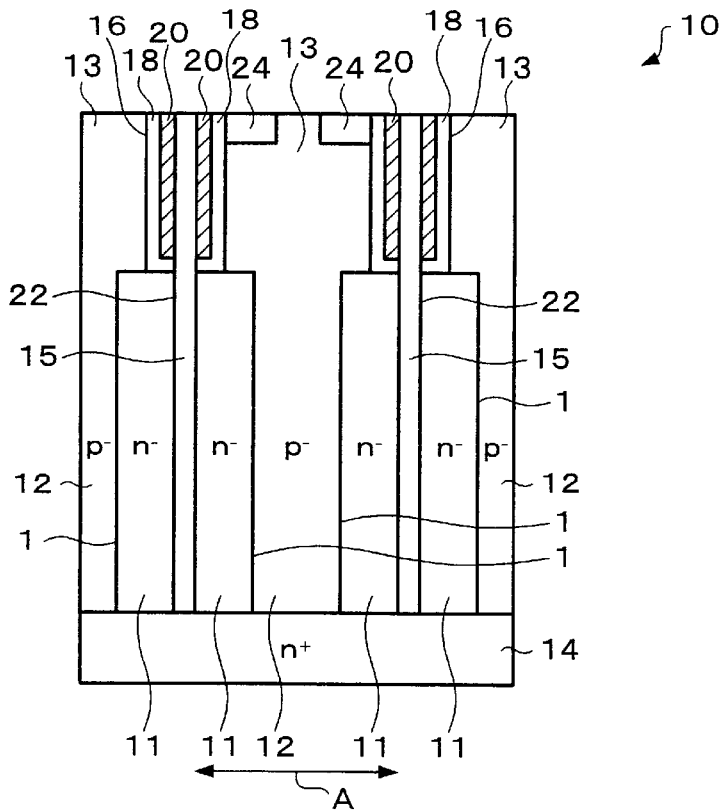
FIG. 1 is a cross-sectional view showing a vertical semiconductor device manufactured using a method of manufacturing a vertical semiconductor device according to a first embodiment.

FIG. 1 is a cross-sectional view showing a vertical semiconductor device manufactured according to a first embodiment of the present invention. One of the features of this vertical semiconductor device is that graded junctions are formed between $n^-$-type semiconductor regions 11 and $p^-$-type semiconductor regions 12. Details of the structure are described below. This vertical semiconductor device 10 is a high voltage UMOS. The vertical semiconductor device 10 is formed on a silicon substrate, for example. The silicon substrate includes an $n^+$-type drain region 14. The $p^-$-type semiconductor regions 12 and the $n^-$-type semiconductor regions 11 are formed on the drain region 14, arranged alternately. A $p^-$-type silicon layer 13 is located on the $p^-$-type semiconductor regions 12 and the $n^-$-type semiconductor regions 11. Second trenches 16 are formed in the $p^-$-type silicon layer 13. The second trenches 16 are located on the $n^-$-type semiconductor regions 11. Gate electrodes 20 covered with gate oxide films 18 are buried in the second trenches 16. $n^+$-type source regions 24 are formed in the $p^-$-type silicon layer 13 in contact with the second trenches 16. First trenches 22 extend into the gate electrodes 20 and the $n^-$-type semiconductor regions 11 in the vertical direction. In other words, the first trenches 22 divide the gate electrodes 20 and the $n^-$-type semiconductor regions 11 in two. The first trenches 22 reach the drain region 14. The first trenches 22 are filled with silicon oxide films 15.

Description of Manufacture Method

Figure 2:
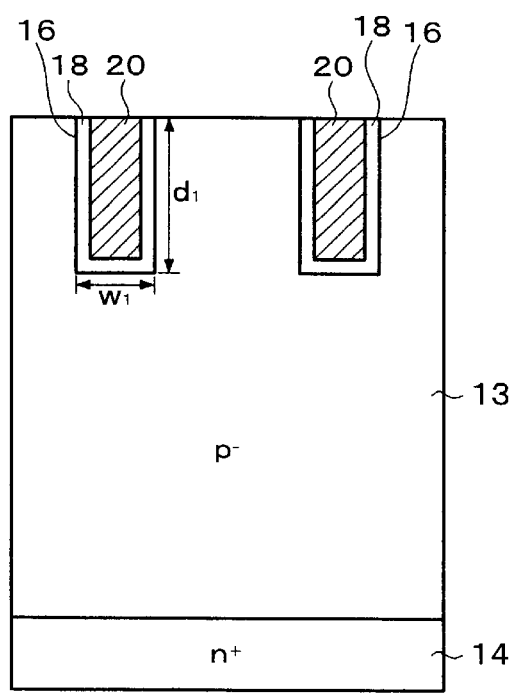
FIG. 2 is a cross-sectional view showing a silicon substrate for illustrating a first step of the method of manufacturing a vertical semiconductor device according to the first embodiment.

A method of manufacturing the vertical semiconductor device 10 is described below. One of the features of this method is that the $n^-$-type semiconductor regions 11 are formed by vapor phase diffusion. The method is described below in detail. A silicon substrate including the $n^+$-type drain region 14 is prepared as shown in FIG. 2. The concentration in the drain region 14 is from $1\times10^{18}$ cm$^{-3}$ to $1\times10^{21}$ cm$^{-3}$. The $p^-$-type silicon layer 13 is epitaxially grown on the drain region 14. The concentration in the $p^-$-type silicon layer 13 is from $1\times10^{13}$ cm$^{-3}$ to $1\times10^{18}$ cm$^{-3}$. The thickness of the $p^-$-type silicon layer 13 is 1 $\mu$m to 100 $\mu$m.

The second trenches 16 are formed in the $p^-$-type silicon layer 13 by photolithography and etching. The depth d1 and the width w1 of the second trenches 16 are respectively 0.5 $\mu$m to 10 $\mu$m and 0.1 $\mu$m to 10 $\mu$m. The gate oxide films 18 are formed at the bottom and on the side of the second trenches 16 by thermal oxidation. A polysilicon layer is formed on the $p^-$-type silicon layer 13 by CVD so that the second trenches 16 are filled with the polysilicon layer. The entire surface of the polysilicon layer formed on the $p^-$-type silicon layer 13 is etched so that the polysilicon layers are allowed to remain in the second trenches 16. These polysilicon layers become the gate electrodes 20.

Figure 3:
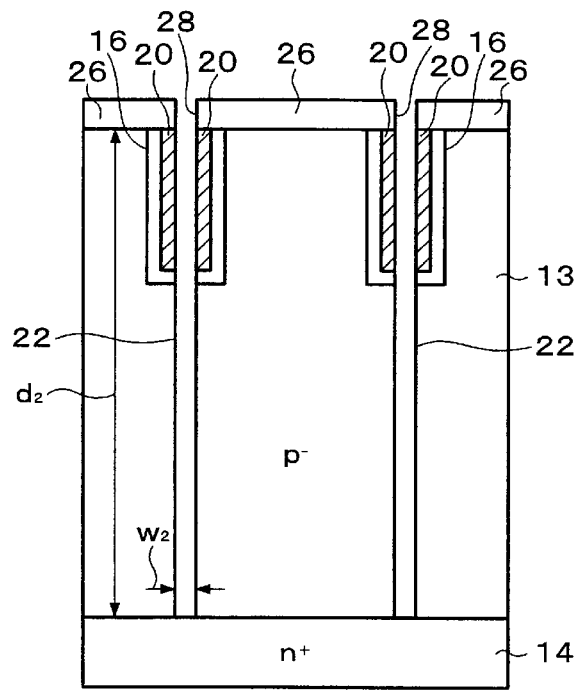
FIG. 3 is a cross-sectional view showing a silicon substrate for illustrating a second step of the method of manufacturing a vertical semiconductor device according to the first embodiment.

A silicon oxide film 26 with a thickness of 1 $\mu$m to 5 $\mu$m is formed on the $p^-$-type silicon layer 13 by CVD, as shown in FIG. 3. The silicon oxide film 26 is selectively removed by photolithography and etching, thereby forming openings 28 which expose part of the gate electrodes 20. The gate electrodes 20 and the $p^-$-type silicon layer 13 are selectively removed by RIE (Reactive Ion Etching) which is an example of anisotropic etching using the silicon oxide film 26 as a mask, thereby forming the first trenches 22 which reach the drain region 14. The depth d2 and the width w2 of the first trench 22 are respectively 1 $\mu$m to 100 $\mu$m and 0.1 $\mu$m to 10 $\mu$m.

Figure 4:
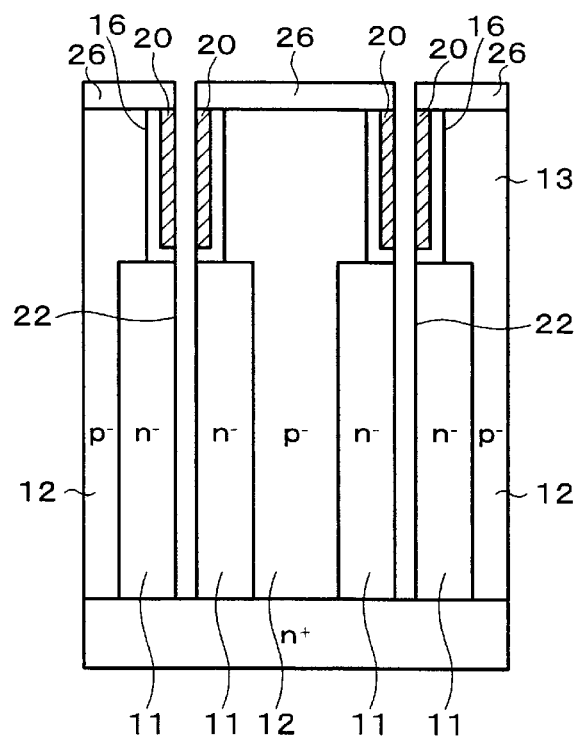
FIG. 4 is a cross-sectional view showing a silicon substrate for illustrating a third step of the method of manufacturing a vertical semiconductor device according to the first embodiment.

As shown in FIG. 4, n-type impurities are diffused into the $p^-$-type silicon layer 13 by vapor phase diffusion through the sidewalls of the first trenches 22, thereby forming the $n^-$-type semiconductor regions 11 in the $p^-$-type silicon layer 13 near the first trenches 22. The diffusion conditions are as follows.

Diffusion source: PH3
Diffusion temperature: 800° C. to 900° C.
Diffusion time: 1 min to 100 min Regions of the p⁻-type silicon layer 13 in which the n-type impurities are not diffused become the p⁻-type semiconductor regions 12. A structural section in which the p⁻-type semiconductor regions 12 and the n⁻-type semiconductor regions 11 are arranged alternately is thus formed in the p⁻-type silicon layer 13.

Figure 5:
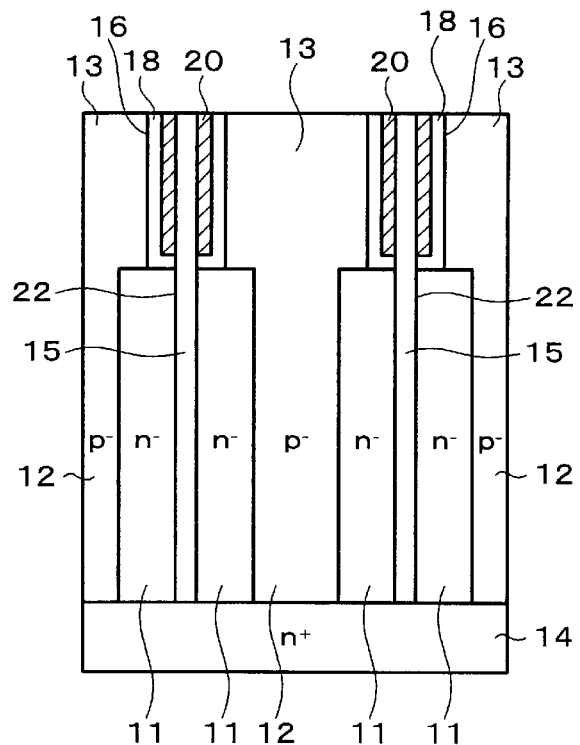
FIG. 5 is a cross-sectional view showing a silicon substrate for illustrating a fourth step of the method of manufacturing a vertical semiconductor device according to the first embodiment.

The silicon oxide film 26 is removed by wet etching or dry etching, as shown in FIG. 5. An insulating film such as a silicon oxide film is formed on the p⁻-type silicon layer 13 by CVD so that the first trenches 22 are filled with the silicon oxide film. The entire surface of the silicon oxide film formed on the p⁻-type silicon layer 13 is etched so that the silicon oxide films are allowed to remain in the first trenches 22 (these silicon oxide films are hereinafter called "silicon oxide films 15").

The source regions 24 are formed by implantation of arsenic ions into the p⁻-type silicon layer 13 using a resist as a mask, as shown in FIG. 1. The vertical semiconductor device 10 is completed in this manner.

Description of Effect

In the first embodiment, the n⁻-type semiconductor regions 11 are formed by diffusing the n-type impurities into the p⁻-type silicon layer 13 (FIG. 3) through the sidewalls of the first trenches 22, as shown in FIG. 4. Therefore, graded junctions are formed between the n⁻-type semiconductor regions 11 and the p⁻-type semiconductor regions 12 of the vertical semiconductor device 10. This feature is described below in detail.

Figure 33:
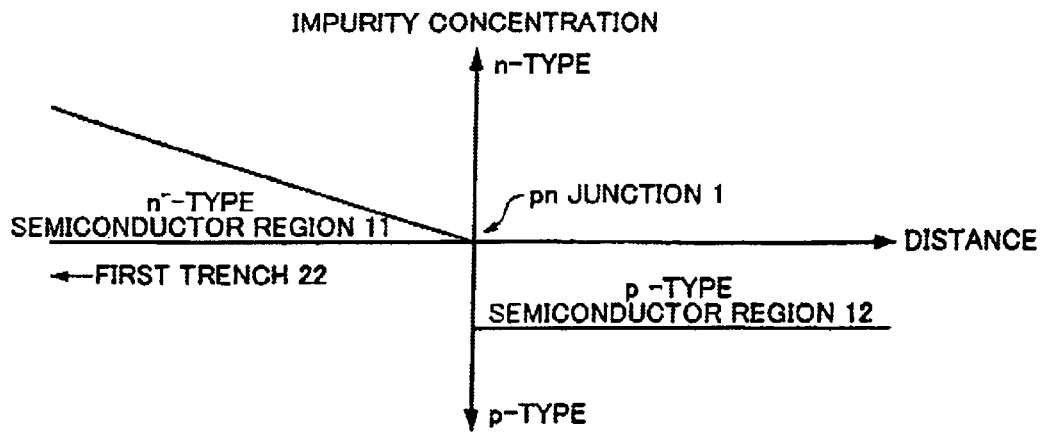
FIG. 33 is a view showing an impurity concentration-near a pn junction 1 in the vertical semiconductor device according to the present invention.
Figure 34:
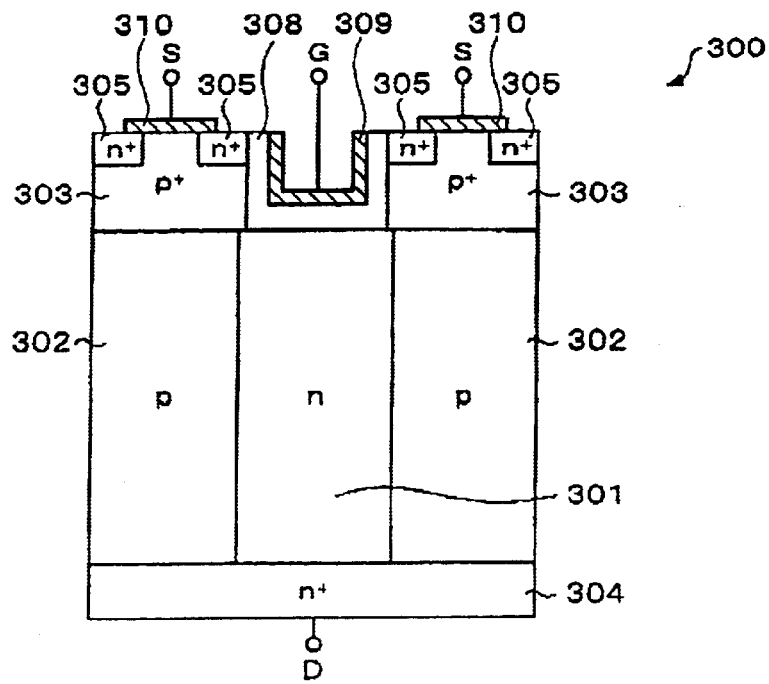
FIG. 34 is a cross-sectional view showing a high voltage MOSFET disclosed in U.S. Pat. No. 5,216,275.

The n-type impurity distribution is graded in directions (arrow A) in which the n⁻-type semiconductor regions 11 and the p⁻-type semiconductor regions 12 are arranged alternately, as shown in FIG. 1. The n⁻-type impurity distribution increases from pn junctions 1 formed between the n⁻-type semiconductor regions 11 and the p⁻-type semiconductor regions 12 toward the first trenches 22. FIG. 33 is a view showing this state. FIG. 33 is a view showing the impurity concentration near the pn junctions 1 of the vertical semiconductor device 10. In the n⁻-type semiconductor regions 11, the amount of n-type impurities is comparatively smaller near the pn junctions 1 but comparatively larger near the first trenches 22. However, since the p⁻-type semiconductor regions 12 are formed by epitaxial growth, the p-type impurities are distributed almost uniformly in the p⁻-type semiconductor regions 12. Therefore, one-sided abrupt junctions are formed between the n⁻-type semiconductor regions 11 and the p⁻-type semiconductor regions 12.

Effects produced by these graded junctions are described below. According to the vertical semiconductor device 10, since the n-type impurity distribution is graded in the n⁻-type semiconductor regions 11, depletion layer can spread widely in regions in which the n-type impurity concentration is lower. Therefore, the n⁻-type semiconductor regions 11 and the p⁻-type semiconductor regions 12 can be easily depleted even if the widths of these regions are comparatively greater, whereby an increase in the breakdown voltage can be realized.

When a voltage is applied to the junctions, the electric field strength generally reaches a maximum at the junctions. The lower the impurity concentration, the lower the electric field strength at the same applied voltage. Therefore, the junction breakdown voltage increases. According to the first embodiment, since the distribution of the n-type impurity concentration is lower near the pn junctions 1, the junction breakdown voltage of the pn junctions 1 can be increased.

Effects produced by the method of the first embodiment are described below. As shown in FIG. 4, the p⁻-type silicon layer 13 which becomes the p⁻-type semiconductor regions 12 is formed and the n⁻-type semiconductor regions 11 are formed by diffusing the n-type impurities into the p⁻-type silicon layer 13 through the sidewalls of the first trenches 22 formed in the p⁻-type silicon layer 13. Specifically, the n⁻-type semiconductor regions 11 are formed without filling the first trenches 22 by epitaxial growth. Therefore, the degree of integration of the vertical semiconductor device 10 can be increased.

The above-described effects are also applicable to other embodiments.

In the vertical semiconductor device 10 according to the first embodiment, the second trenches 16 are formed on the n⁻-type semiconductor regions 11, and the first trenches 22 formed in the n⁻-type semiconductor regions 11 are located right under the second trenches 16. Therefore, the degree of integration of the vertical semiconductor device 10 can be increased in comparison to a structure in which the first trenches 22 are formed so as to be located outside the second trenches 16 in a plan view.

Second Embodiment

Figure 6:
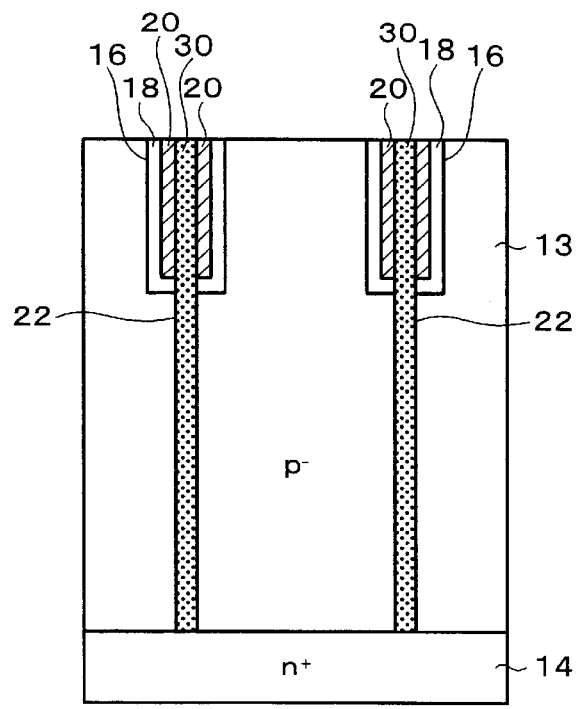
FIG. 6 is a cross-sectional view showing a silicon substrate for illustrating a first step of a method of manufacturing a vertical semiconductor device according to a second embodiment.

A method of manufacturing the vertical semiconductor device according to a second embodiment is described below. The second embodiment differs from the first embodiment in that the n⁻-type semiconductor regions 11 are formed by solid phase diffusion. The method is described below in detail. After the steps shown in FIGS. 2 and 3 completed, a PSG film 30 is formed on the p⁻-type silicon layer 13 by CVD so that the first trenches 22 are filled with the PSG film 30, as shown in FIG. 6. The PSG film 30 contains n-type impurities such as TMP (trimethyl phosphite).

Figure 7:
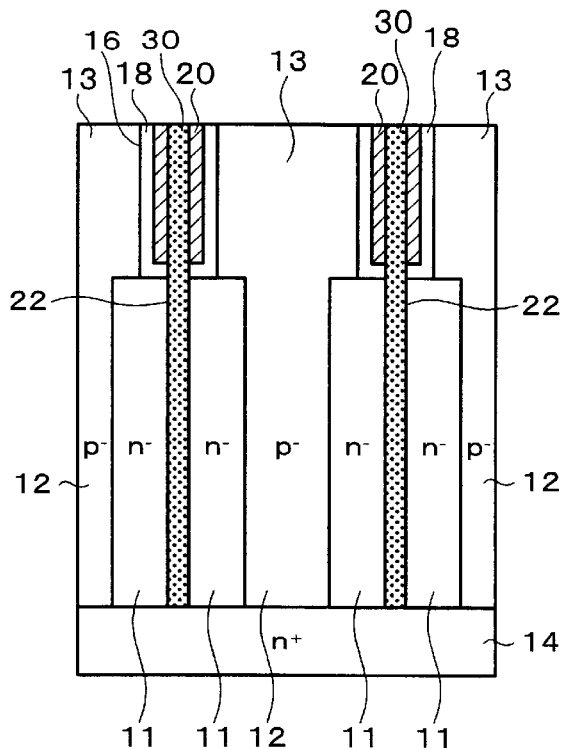
FIG. 7 is a cross-sectional view showing a silicon substrate for illustrating a second step of the method of manufacturing a vertical semiconductor device according to the second embodiment.

As shown in FIG. 7, n-type impurities contained in the PSG film 30 are diffused into the p⁻-type silicon layer 13 by solid phase diffusion through the sidewalls of the first trenches 22, thereby forming the n⁻-type semiconductor regions 11 in the p⁻-type silicon layer 13 near the first trenches 22. The diffusion conditions are as follows.

Diffusion source: PSG

Diffusion temperature: 900° C. to 1100° C.

Diffusion time: 1 min to 300 min

Figure 8:
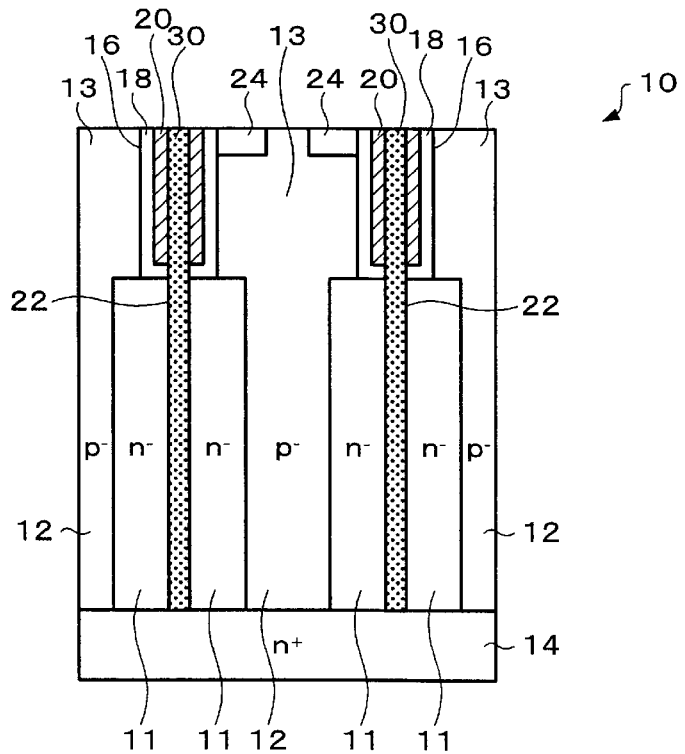
FIG. 8 is a cross-sectional view showing a silicon substrate for illustrating a third step of the method of manufacturing a vertical semiconductor device according to the second embodiment.

Regions of the p⁻-type silicon layer 13 in which the n-type impurities are not diffused become the p⁻-type semiconductor regions 12. A structural section in which the p⁻-type semiconductor regions 12 and the n⁻-type semiconductor regions 11 are arranged alternately is thus formed in the p⁻-type silicon layer 13. The source regions 24 are formed using the same method as in the first embodiment. The vertical semiconductor device 10 shown in FIG. 8 is completed in this manner.

According to the second embodiment, as shown in FIG. 7, the p⁻-type silicon layer 13 which becomes the p⁻-type semiconductor regions 12 is formed and the n⁻-type semiconductor regions 11 are formed by diffusing the n-type impurities into the p⁻-type silicon layer 13 by solid phase diffusion through the sidewalls of the first trenches 22 formed in the p⁻-type silicon layer 13. Specifically, the n⁻-type semiconductor regions 11 are formed without filling the first trenches 22 by epitaxial growth. Therefore, the degree of integration of the vertical semiconductor device 10 can be increased.

Third embodiment

Description of Structure

Figure 9:
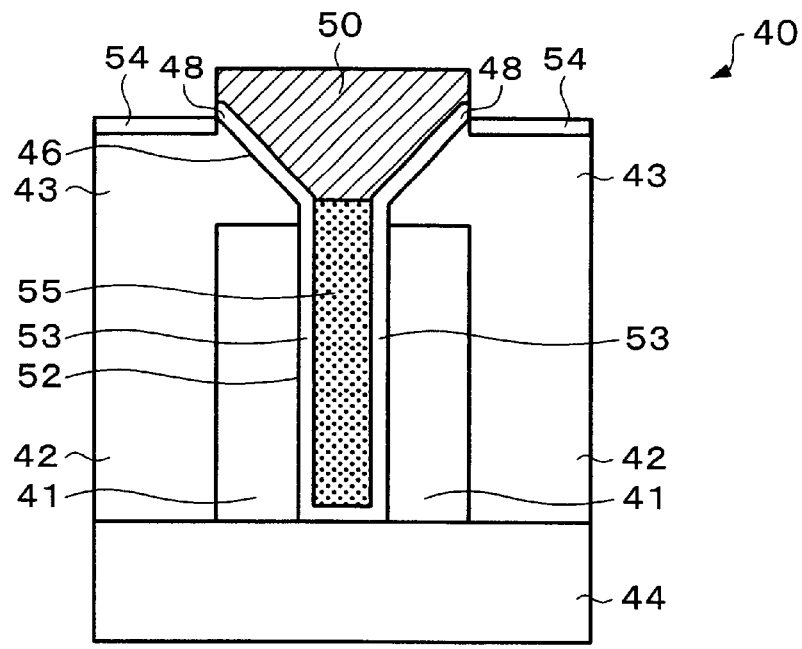
FIG. 9 is a cross-sectional view showing a vertical semiconductor device manufactured using a method of manufacturing a vertical semiconductor device according to a third embodiment.

FIG. 9 is a cross-sectional view showing a vertical semiconductor device according to a third embodiment of the present invention. One of the features of this vertical semiconductor device 40 is that a first trench 52 is located right under a second trench 46. Details of the structure are described below. The vertical semiconductor device 40 is a high voltage VMOS. The vertical semiconductor device 40 is formed on a silicon substrate. The silicon substrate includes an n$^+$-type drain region 44. p$^-$-type semiconductor regions 42 and n$^-$-type semiconductor regions 41 are formed on the drain region 44, arranged alternately. A p$^-$-type silicon layer 43 is located on the p$^-$-type semiconductor regions 42 and the n$^-$-type semiconductor regions 41. The second trench 46 is formed in the p$^-$-type silicon layer 43. The side of the second trenches 46 is in the shape of a cone. Specifically, the second trench 46 has a shape in which the width thereof becomes smaller towards the bottom. The first trench 52 is continuous with the second trench 46. The first trench 52 extends in the n$^-$-type semiconductor region 41 in the vertical direction. In other words, the first trench 52 divides the n$^-$-type semiconductor region 41 in two. The first trench 52 is filled with a PSG film 55 covered with a thin silicon oxide film 53. A gate oxide film 48 is formed on the side of the second trench 46. A gate electrode 50 is formed on the gate oxide film 48. The gate electrode 50 is buried in the second trench 46. n$^+$-type source regions 54 are formed in the p$^-$-type silicon layer 43 in contact with the second trench 46.

Description of Manufacture Method

Figure 10:
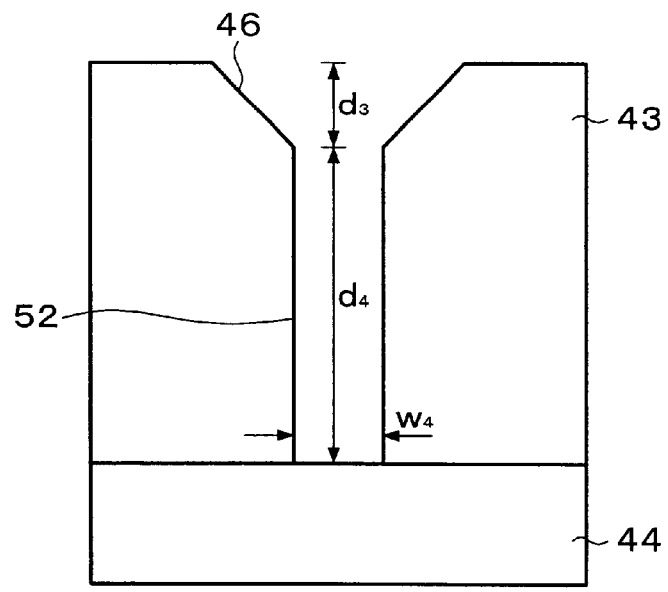
FIG. 10 is a cross-sectional view showing a silicon substrate for illustrating a first step of the method of manufacturing a vertical semiconductor device according to the third embodiment.
Figure 11:
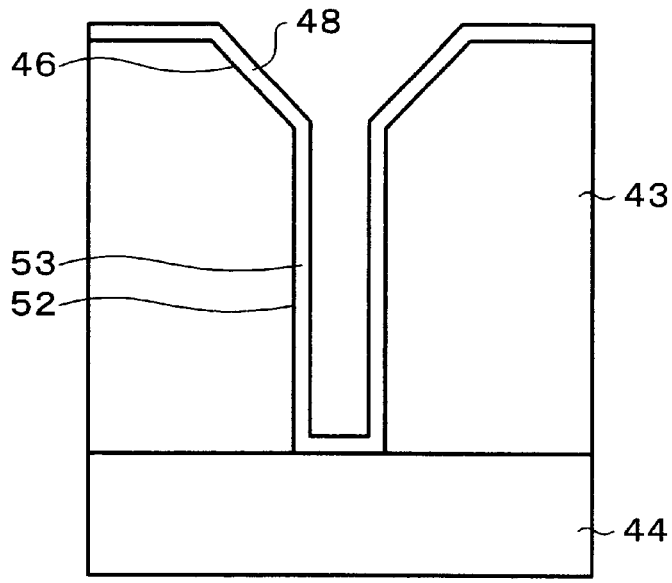
FIG. 11 is a cross-sectional view showing a silicon substrate for illustrating a second step of the method of manufacturing a vertical semiconductor device according to the third embodiment.

A manufacture method of the vertical semiconductor device 40 is described below. A silicon substrate including the n$^+$-type drain region 44 is prepared as shown in FIG. 10. The concentration in the drain region 44 is from $1 \times 10^{18}$ cm$^{-3}$ to $1 \times 10^{21}$ cm$^{-3}$. The p$^-$-type silicon layer 43 is epitaxially grown on the drain region 44. The concentration in the p$^-$-type silicon layer 43 is from $1 \times 10^{13}$ cm$^{-3}$ to $1 \times 10^{18}$ cm$^{-3}$. The thickness of the p$^-$-type silicon layer 43 is 1 μm to 100 μm.

The second trench 46 is formed in the p$^-$-type silicon layer 43 by isotropically etching the p$^-$-type silicon layer 43 using a silicon oxide film as a mask. The depth d3 of the second trench 46 is 0.5 μm to 10 μm. The first trench 52 is formed in the p$^-$-type silicon layer 43 by anisotropically etching the p$^-$-type silicon layer 43 using the same mask. The depth d4 of the first trench 52 is 1 μm to 100 μm. The width w4 of the first trench 52 is 0.1 μm to 10 μm. A silicon oxide film is formed on the sides of the second trench 46 and the first trench 52 by thermal oxidation. The silicon oxide film formed on the side of the second trench 46 becomes the gate oxide film 48. The silicon oxide film formed on the side of the first trench 52 becomes the silicon oxide film 53.

Figure 12:
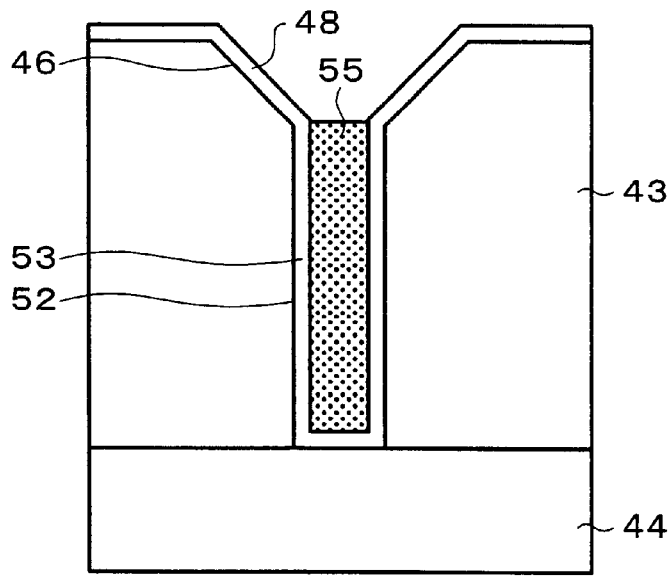
FIG. 12 is a cross-sectional view showing a silicon substrate for illustrating a third step of the method of manufacturing a vertical semiconductor device according to the third embodiment.

For example, the PSG film 55 is formed by CVD so as to cover the p$^-$-type silicon layer 43. The PSG film 55 is annealed at a temperature of 800° C. to 900° C. for 10 min to 300 min, for example. This causes the PSG film 55 to reflow and buried in the first trench 52, as shown in FIG. 12. Since the silicon oxide film 53 functions as a diffusion barrier, diffusion of n-type impurities into the p$^-$-type silicon layer 43 can be prevented.

The n-type impurities contained in the PSG film 55 are diffused into the p$^-$-type silicon layer 43 by solid phase diffusion through the sidewall of the first trench 52, thereby forming the n$^-$-type semiconductor regions 41 in the p$^-$-type silicon layer 43 near the first trench 52. The diffusion conditions are as follows.

Diffusion source: PSG
Diffusion temperature: 900° C. to 1100° C.
Diffusion time: 1 min to 300 min
Regions of the p$^-$-type silicon layer 43 in which the n-type impurities are not diffused become the p$^-$-type semiconductor regions 42. A structural section in which the p$^-$-type semiconductor regions 42 and the n$^-$-type semiconductor regions 41 are arranged alternately is thus formed in the p$^-$-type silicon layer 43.

Figure 14:
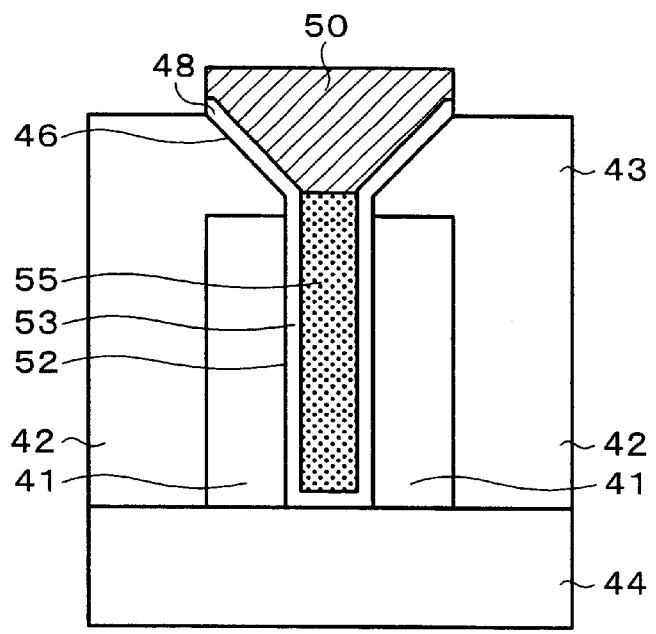
FIG. 14 is a cross-sectional view showing a silicon substrate for illustrating a fifth step of the method of manufacturing a vertical semiconductor device according to the third embodiment.

A polysilicon film is formed by CVD so that the second trench 46 is filled therewith, as shown in FIG. 14. The gate electrode 50 is formed by patterning this polysilicon film. Using a resist as a mask, n-type impurities such as phosphorus ions are implanted into the p$^-$-type silicon layer 43 thereby forming the source regions 54, as shown in FIG. 9. The vertical semiconductor device 40 is completed in this manner.

Description of Effect

Figure 13:
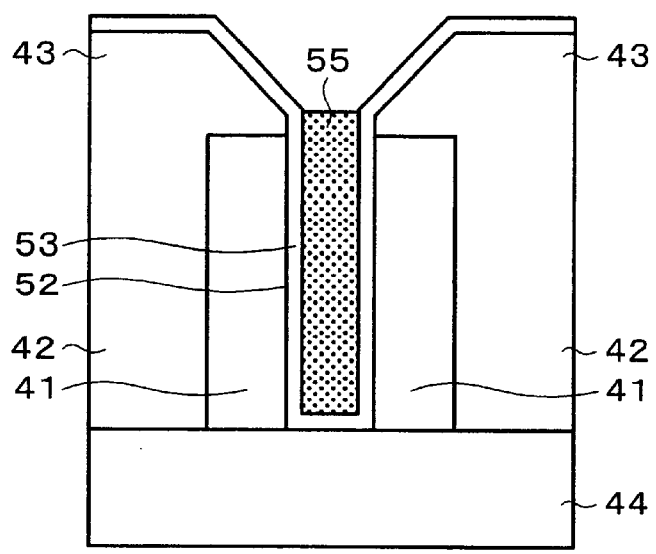
FIG. 13 is a cross-sectional view showing a silicon substrate for illustrating a fourth step of the method of manufacturing a vertical semiconductor device according to the third embodiment.

According to the third embodiment, the n$^-$-type semiconductor regions 41 are formed by diffusing the n-type impurities contained in the PSG film 55 into the p$^-$-type silicon layer 43 by solid phase diffusion through the sidewall of the first trench 52, as shown in FIG. 13. Therefore, the n$^-$-type semiconductor regions 41 can be formed without filling the first trenches 52 by epitaxial growth. This enables the degree of integration of the vertical semiconductor device 40 to be increased.

Fourth Embodiment

Description of Structure

Figure 15:
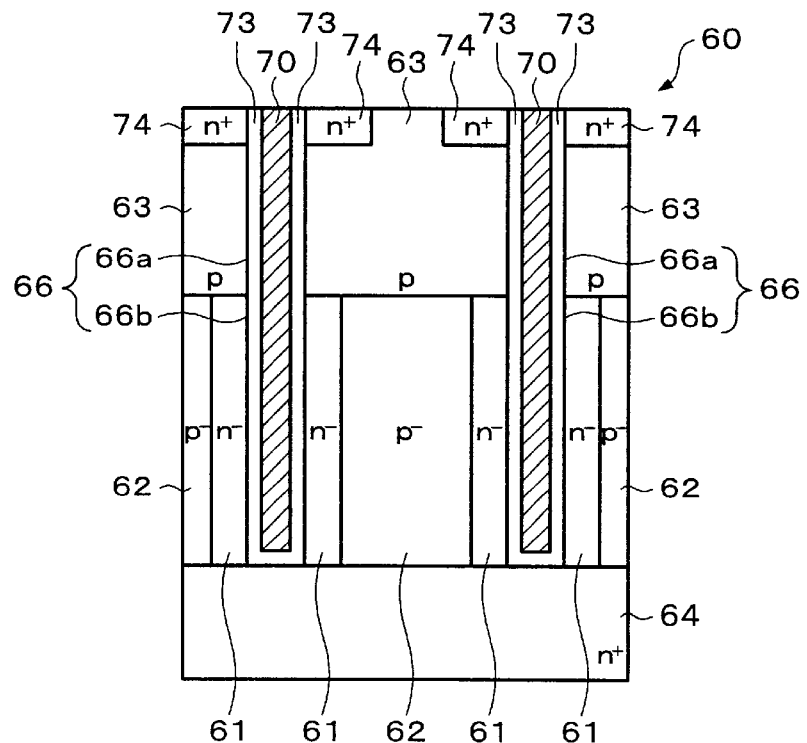
FIG. 15 is a cross-sectional view showing a vertical semiconductor device manufactured using a method of manufacturing a vertical semiconductor device according to a fourth embodiment.

FIG. 15 is a cross-sectional view showing a vertical semiconductor device according to a fourth embodiment of the present invention. One of the features of this vertical semiconductor device 60 is that buried electrode layers 70 are disposed in first trenches 66b formed in n$^-$-type semiconductor regions 61. Details of the structure are described below. The vertical semiconductor device 60 includes an n$^+$-type drain region 64, a p-type silicon layer 63 which becomes a body region, n$^+$-type source regions 74, and buried electrode layers 70 including gate electrodes.

The n$^+$-type drain region 64 is formed in a silicon substrate. A structural section in which p$^-$-type semiconductor regions 62 and n$^-$-type semiconductor regions 61 are arranged alternately is located on the drain region 64. A p-type silicon layer 63 is located on this structural section. A plurality of trenches 66 is formed through the p-type silicon layer 63 and the n$^-$-type semiconductor regions 61 so as to reach the drain region 64. Each trench 66 consists of the first trench 66b and a second trench 66a continuous with the first trench 66b. The first trenches 66b are formed in the n$^-$-type semiconductor regions 61. The second trenches 66a are formed in the p-type silicon layer 63.

The buried electrode layers 70 are formed in the trenches 66. Silicon oxide films 73 are formed on the sidewall and at the bottom of the trenches 66 so as to cover the buried electrode layers 70. The silicon oxide films 73 function as gate insulating films. The n$^+$-type source regions 74 are formed in the p-type silicon layer 63 so as to surround the trenches 66.

Description of Manufacture Method

Figure 16:
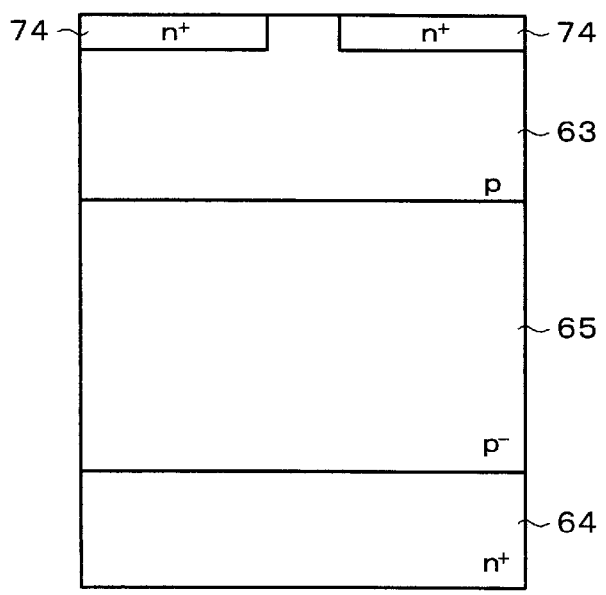
FIG. 16 is a cross-sectional view showing a silicon substrate for illustrating a first step of the method of manufacturing a vertical semiconductor device according to the fourth embodiment.

A method of manufacturing the vertical semiconductor device 60 is described below with reference to FIGS. 15 to 18. A silicon substrate including the n$^+$-type drain region 64 is prepared as shown in FIG. 16. The concentration in the drain region 64 is from $1 \times 10^{18}$ cm$^{-3}$ to $1 \times 10^{21}$ cm$^{-3}$. The p$^-$-type silicon layer 65 is epitaxially grown on the drain region 64. The concentration of the p$^-$-type silicon layer 65 is from $1 \times 10^{15}$ cm cm$^{-3}$ to $5 \times 10^{16}$ cm$^{-3}$. The thickness of the p$^-$-type silicon layer 65 is 5 μm to 40 μm.

The p-type silicon layer 63 is epitaxially grown on the p$^-$-type silicon layer 65. The concentration in the p-type silicon layer 63 is from $1 \times 10^{16}$ cm$^{-3}$ to $5 \times 10^{17}$ cm$^{-3}$. The thickness of the p$^-$-type silicon layer 63 is 1 μm to 5 μm.

Phosphorus ions are implanted into the p-type silicon layer 63 using a resist (not shown) as a mask, thereby selectively forming the source regions 74 on the surface of the p-type silicon layer 63.

Figure 17:
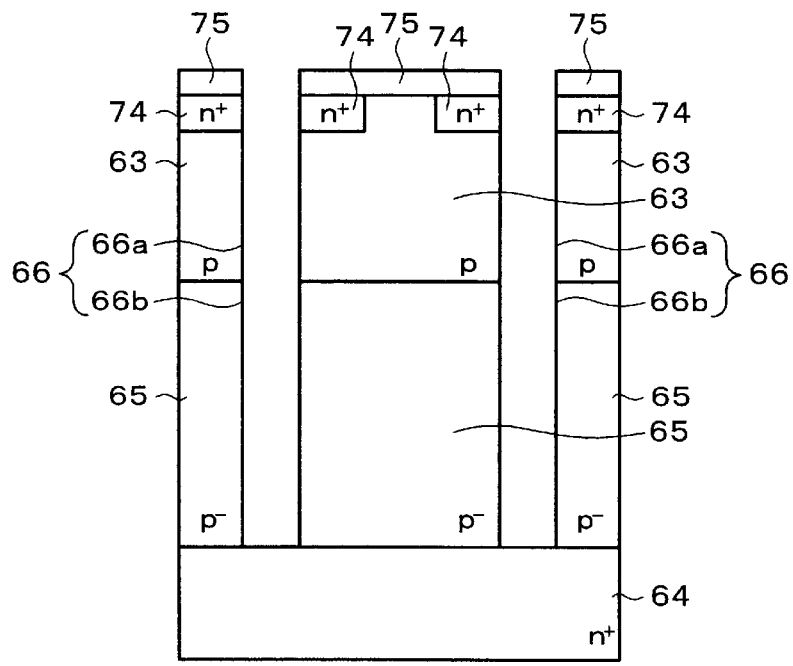
FIG. 17 is a cross-sectional view showing a silicon substrate for illustrating a second step of the method of manufacturing a vertical semiconductor device according to the fourth embodiment.

A silicon oxide film 75 is formed on the p-type silicon layer 63, as shown in FIG. 17. The silicon oxide film 75 is patterned into a specific shape. The trenches 66 are formed by anisotropically etching the p-type silicon layer 63 and the p$^-$-type silicon layer 65 using the silicon oxide film 75 as a mask. The width of the trenches 66 is 1 μm to 5 μm. The silicon oxide film 75 is removed.

Figure 18:
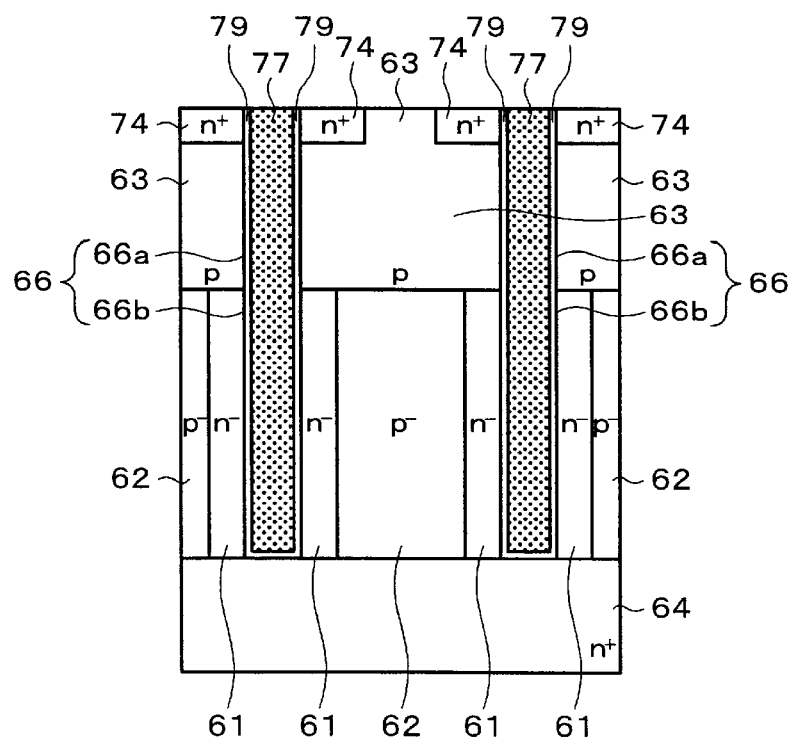
FIG. 18 is a cross-sectional view showing a silicon substrate for illustrating a third step of the method of manufacturing a vertical semiconductor device according to the fourth embodiment.

Silicon oxide films 79 are formed on the sidewall and at the bottom of the trenches 66 by thermal oxidation, for example, as shown in FIG. 18. The silicon oxide films 79 are formed in order to increase diffusion controllability during the formation of the n$^-$-type semiconductor regions 61. The thickness of the silicon oxide films 79 is determined taking this function into consideration. The thickness of the silicon oxide films 79 is 5 nm to 50 nm, for example.

A doped polysilicon film 77 is formed on the p-type silicon layer 63 so that the trenches 66 are filled therewith. The doped polysilicon films 77 become a diffusion source when forming the n$^-$-type semiconductor regions 61. The doped polysilicon films 77 are doped with n-type impurities. The n-type impurities are phosphorus, for example. The n-type impurity concentration in the doped polysilicon films 77 is from $1 \times 10^{18}$ cm$^{-3}$ to $1 \times 10^{21}$ cm$^{-3}$. The n-type impurities and the impurity concentration are determined taking into consideration the diffusion when forming the n$^-$-type semiconductor regions 61. PSG films may be used as the diffusion source in place of the doped polysilicon films 77.

The n-type impurities contained in the doped polysilicon films 77 are diffused into the p$^-$-type silicon layer 65 (FIG. 17) by solid phase diffusion through the sidewalls of the trenches 66b, thereby forming the n$^-$-type semiconductor regions 61 in the p$^-$-type silicon layer 65 near the trenches 66b. The diffusion conditions are as follows.

Diffusion temperature: 900° C. to 1000° C.

Diffusion time: 10 min to 60 min

Regions of the p$^-$-type silicon layer 65 in which the n-type impurities are not diffused become the p$^-$-type semiconductor regions 62. A structural section in which the p$^-$-type semiconductor regions 62 and the n$^-$-type semiconductor regions 61 are arranged alternately is thus formed in the p$^-$-type silicon layer 65. The n-type impurities are also diffused into the p-type silicon layer 63. However, since the concentration in the p-type silicon layer 63 is comparatively high, n$^-$-type semiconductor regions are not formed in the p-type silicon layer 63.

The doped polysilicon films 77 and the silicon oxide films 79 present in the trenches 66 are removed. A TMAH ((CH$_3$)$_4$NOH) solution at a concentration of 22% and a temperature of 80° C. is used to remove the doped polysilicon films 77, for example. An HF solution at a concentration of 10% and a temperature of 23° C. is used to remove the silicon oxide films 79, for example.

The silicon oxide films 73 which become the gate oxide films are formed on the sidewalls of the trenches 66 by thermal oxidation, as shown in FIG. 15. A polysilicon film which becomes the buried electrode layers 70 is formed on the p-type silicon layer 63 so that the trenches 66 are filled therewith. The polysilicon film formed on the p-type silicon layer 63 is removed by etch back, thereby forming the buried electrode layers 70 in the trenches 66. The vertical semiconductor device 60 is completed in this manner.

Description of Effect

As shown in FIG. 15, accumulation layers can be formed by the buried electrode layers 70 in the n$^-$-type semiconductor regions 61 near the first trenches 66b. The n-type impurity concentration is comparatively higher in the n$^-$-type semiconductor regions 61 near the first trenches 66b due to the graded junctions as described in "Description of effect" in the first embodiment. Therefore, according to the vertical semiconductor device 60, the ON voltage can be further decreased. Moreover, current can be interrupted quickly when turned OFF.

Fifth Embodiment

Description of Structure

Figure 19:
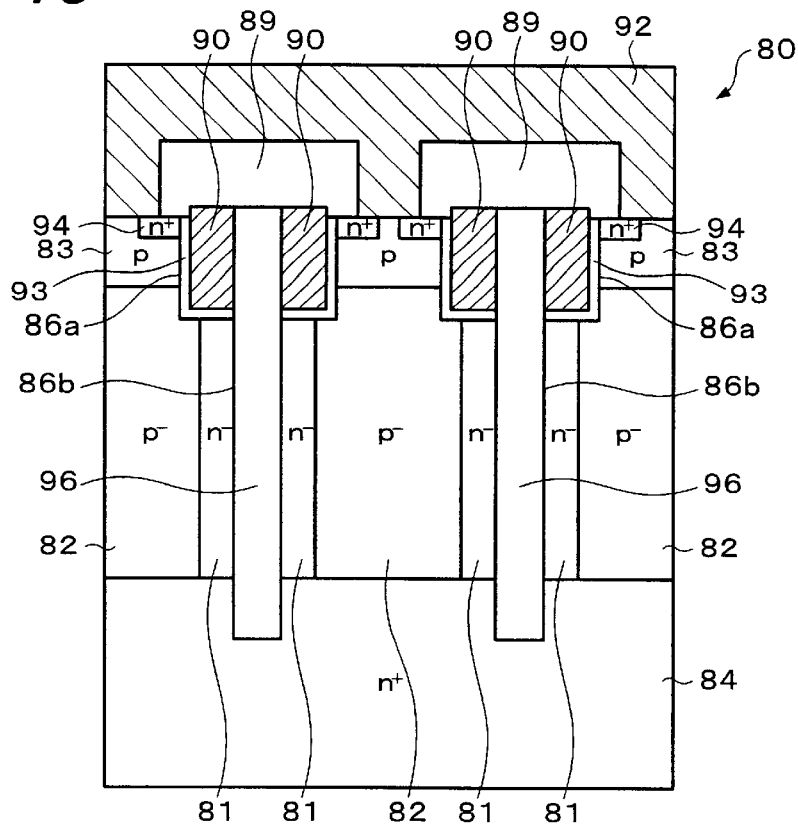
FIG. 19 is a cross-sectional view showing a vertical semiconductor device manufactured using a method of manufacturing a vertical semiconductor device according to a fifth embodiment.

FIG. 19 is a cross-sectional view showing a vertical semiconductor device according to a fifth embodiment of the present invention one of the features of this vertical semiconductor device 80 is that first trenches 86b reach a drain region 84 so as to remove part of the surface of the drain region 84. Details of the structure are described below. The vertical semiconductor device 80 includes the n$^+$-type drain region 84, a p-type silicon layer 83 which be comes a body region, n$^+$-type source regions 94, and buried gate electrodes 90.

The n$^+$-type drain region 84 is formed in a silicon substrate. A structural section in which n$^-$-type semiconductor regions 81 and p$^-$-type semiconductor regions 82 are arranged alternately is formed on the drain region 84. The p-type silicon layer 83 is located on this structural section.

A plurality of first trenches 86b is formed through the n$^-$-type semiconductor regions.81 so as to reach the drain region 84. The second trenches 86a are formed in the p-type silicon layer 83 and located on the n$^-$-type semiconductor regions 81.

The first trenches 86b are filled with buried silicon oxide films 96. Part of the buried silicon oxide films 96 is located at the center of the second trenches 86a. The buried gate electrodes 90 are formed in the second trenches 86a so as to surround the buried silicon oxide films 96. Gate oxide films 93 are formed between the buried gate electrodes 90 and the sidewalls of the second trenches 86a.

The n$^+$-type source regions 94 are formed in the p-type silicon layer 83 so as to surround the second trenches 86a. Silicon oxide films 89, which are interlayer dielectrics, are formed on the p-type silicon layer 83 so as to cover the buried gate electrodes 90. An aluminum electrode 92 is located on the silicon oxide films 89. Contact holes are formed in the silicon oxide films 89. The aluminum electrode 92 is connected to the n$^+$-type source regions 94 and the p-type silicon layer 83 through the contact holes.

Description of Manufacture Method

A method of manufacturing the vertical semiconductor device 80 is described below with reference to FIGS. 19 to 27. As specific values for the impurity concentration, diffusion time, and the like, the values described in the above embodiments can be applied. Therefore, further description is omitted.

Figure 20:
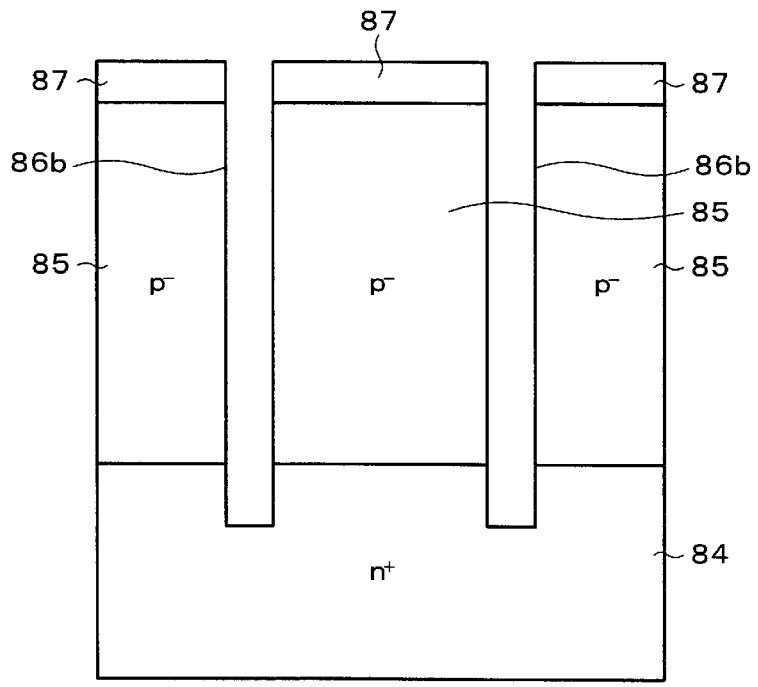
FIG. 20 is a cross-sectional view showing a silicon substrate for illustrating a first step of the method of manufacturing a vertical semiconductor device according to the fifth embodiment.

A silicon substrate including the n$^+$-type drain region 84 is provided as shown in FIG. 20. The p$^-$-type silicon layer 85 is epitaxially grown on the drain region 84. A silicon oxide film 87 is formed on the p$^-$-type silicon layer 85. The silicon oxide film 87 is patterned into a specific shape. The first trenches 86b are formed by anisotropically etching the p$^-$-type silicon layer 85 using the silicon oxide film 87 as a mask.

Figure 21:
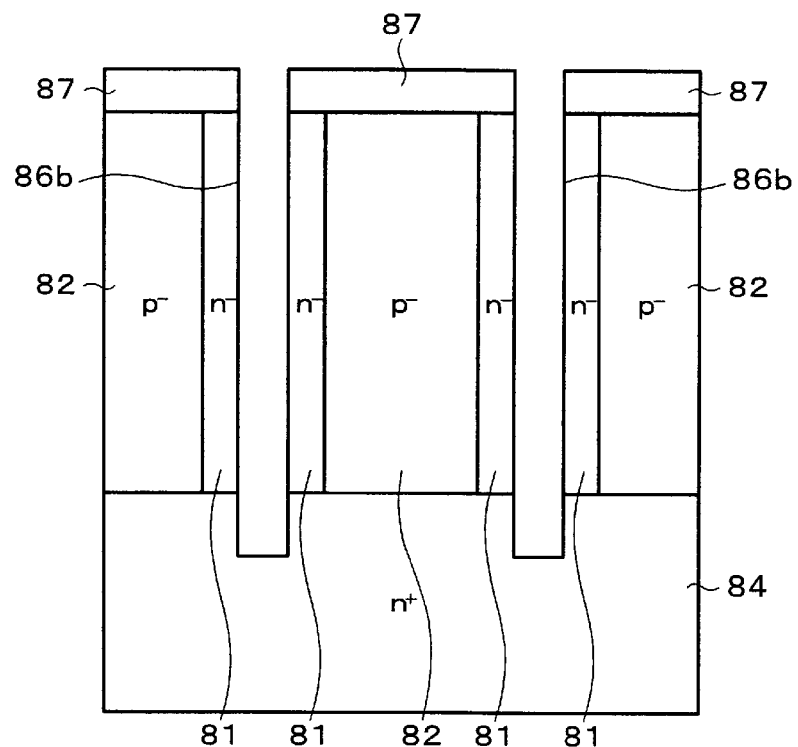
FIG. 21 is a cross-sectional view showing a silicon substrate for illustrating a second step of the method of manufacturing a vertical semiconductor device according to the fifth embodiment.

As shown in FIG. 21, n-type impurities are diffused into the p$^-$-type silicon layer 85 (FIG. 20) through the sidewall of the first trenches 86b by vapor phase diffusion, thereby forming then n$^-$-type semiconductor regions 81 in the p⁻-type silicon layer 85 near the first trenches 86b. The remaining p⁻-type silicon layer 85 becomes the p⁻-type semiconductor regions 82. The silicon oxide film 87 is removed.

Figure 22:
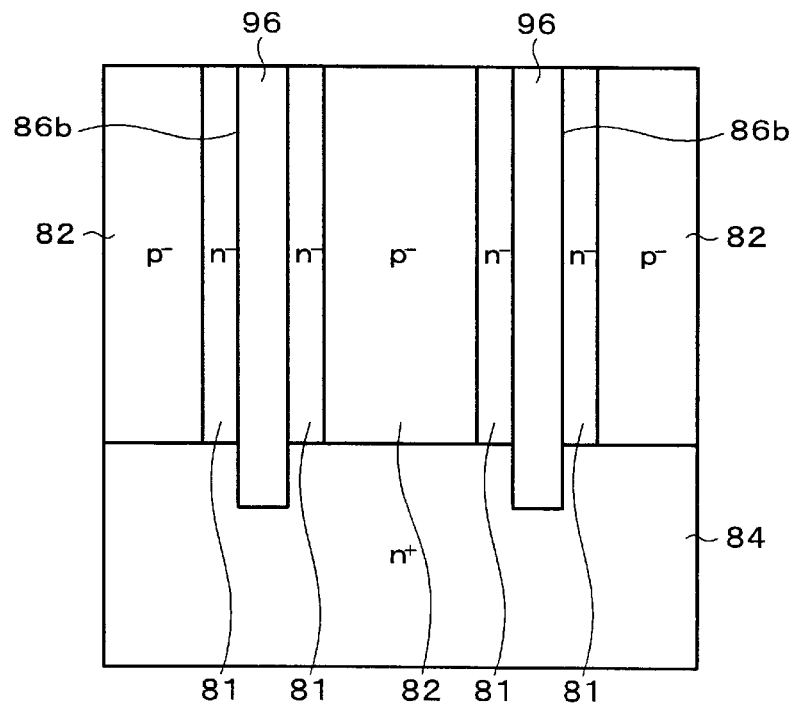
FIG. 22 is a cross-sectional view showing a silicon substrate for illustrating a third step of the method of manufacturing a vertical semiconductor device according to the fifth embodiment.

The buried silicon oxide films 96 are formed in the first trenches 86b by CVD, for example, as shown in FIG. 22. Insulating films may be formed on the sidewall and at the bottom of the first trenches 86b by thermal oxidation, for example, before forming the silicon oxide films.

Figure 23:
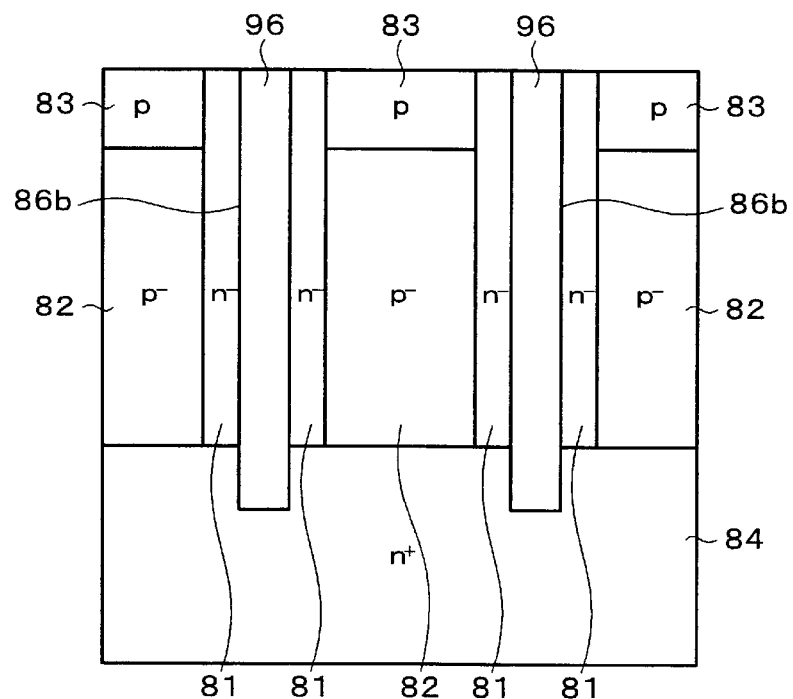
FIG. 23 is a cross-sectional view showing a silicon substrate for illustrating a fourth step of the method of manufacturing a vertical semiconductor device according to the fifth embodiment.

The p-type silicon layers 83 are formed on the p⁻-type semiconductor regions 82 by ion implantation, for example, as shown in FIG. 23.

Figure 24:
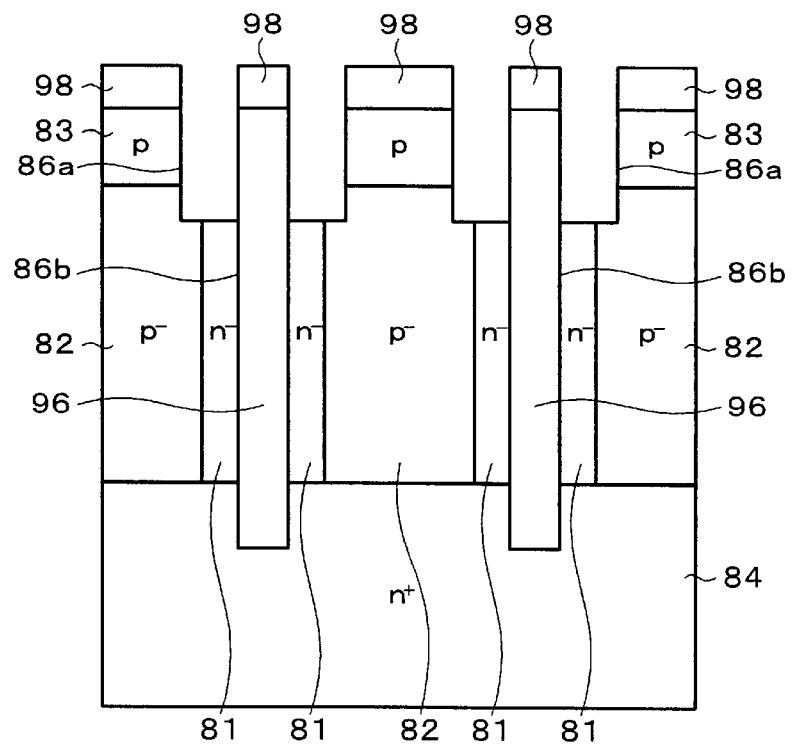
FIG. 24 is a cross-sectional view showing a silicon substrate for illustrating a fifth step of the method of manufacturing a vertical semiconductor device according to the fifth embodiment.

A silicon oxide film 98 which becomes a mask is formed so as to cover the p-type silicon layers 83, as shown in FIG. 24. The silicon oxide film 98 is patterned into a specific shape. The second trenches 86a are formed by anisotropically etching the p-type silicon layer 83 and the p⁻-type semiconductor regions 82 using the silicon oxide film 98 as a mask. The second trenches 86a reach the p⁻-type semiconductor regions 82 through the p-type silicon layers 83. The buried silicon oxide films 96 remain at the center of the second trenches 86a.

Figure 25:
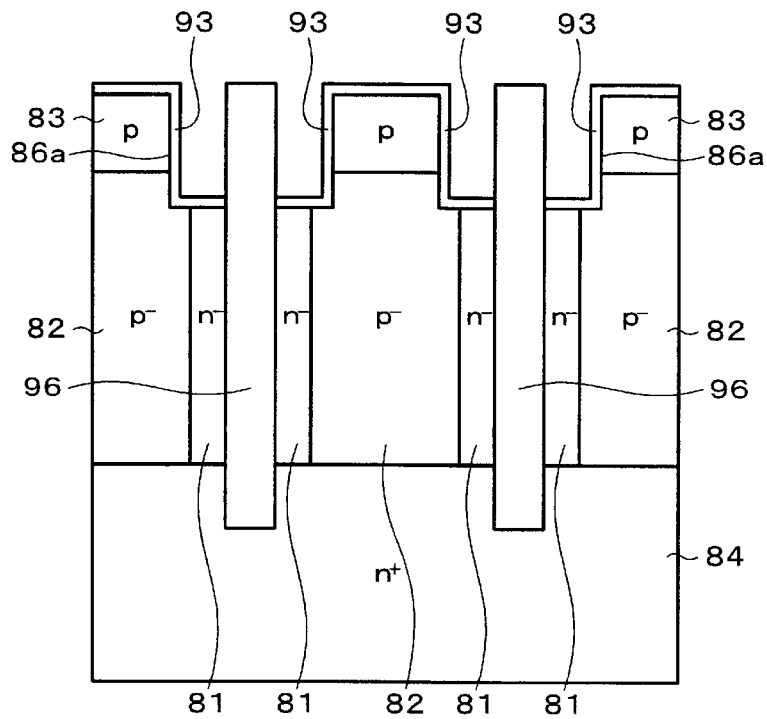
FIG. 25 is a cross-sectional view showing a silicon substrate for illustrating a sixth step of the method of manufacturing a vertical semiconductor device according to the fifth embodiment.

The gate oxide films 93 are formed on the sidewalls of the second trenches 86a by thermal oxidation, for example, as shown in FIG. 25.

Figure 26:
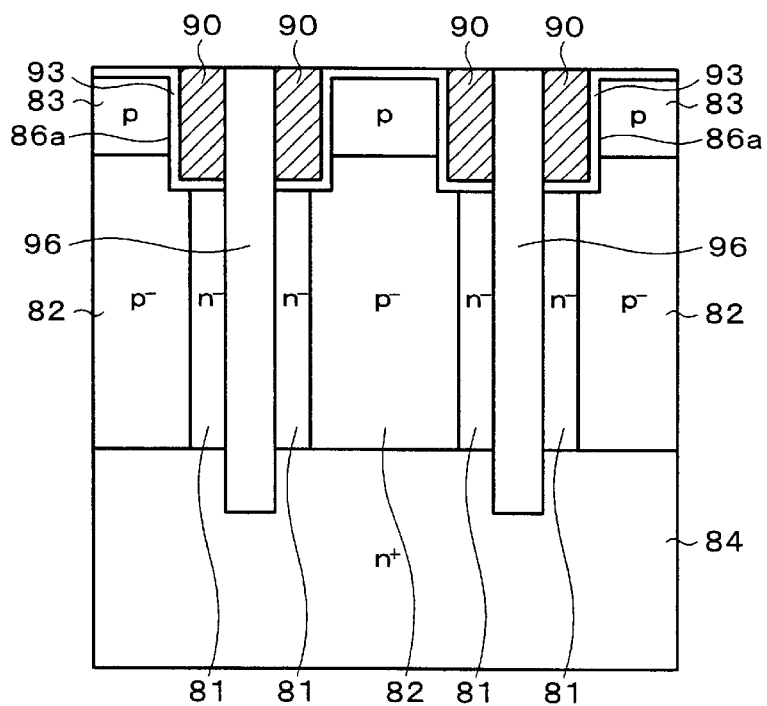
FIG. 26 is a cross-sectional view showing a silicon substrate for illustrating a seventh step of the method of manufacturing a vertical semiconductor device according to the fifth embodiment.

The buried gate electrodes 90 are formed by filling the second trenches 86a with polysilicon films by CVD, for example, as shown in FIG. 26.

Figure 27:
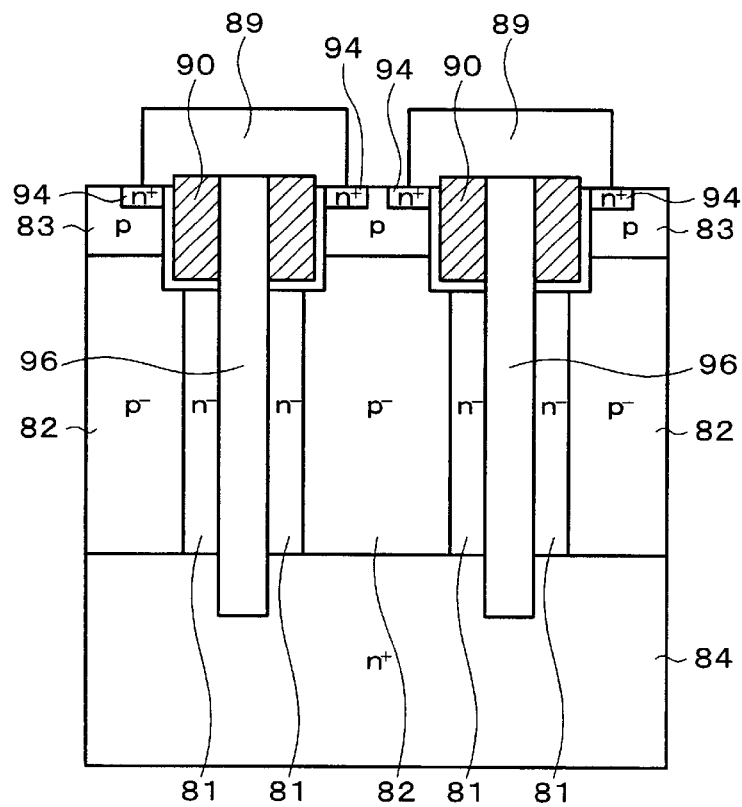
FIG. 27 is a cross-sectional view showing a silicon substrate for illustrating an eighth step of the method of manufacturing a vertical semiconductor device according to the fifth embodiment.

The source regions 94 are selectively formed on the surface of the p-type silicon layers 83 by implantation of arsenic ions into the p-type silicon layers 83 using a resist (not shown) as a mask, as shown in FIG. 27. The silicon oxide film 89 is formed so as to cover the p-type silicon layers 83 by CVD, for example. The silicon oxide film 89 is patterned into a specific shape. The aluminum electrode 92 is formed so as to cover the silicon oxide films 89, as shown in FIG. 19. The vertical semiconductor device 80 is completed in this manner.

Description of Modification

Figure 28:
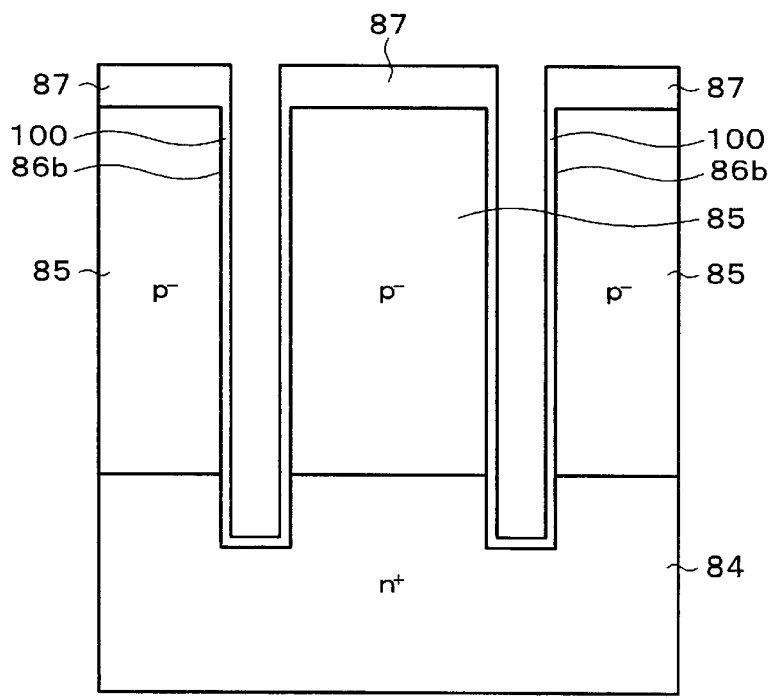
FIG. 28 is a cross-sectional view showing a silicon substrate for illustrating a first step of a modification of the fifth embodiment.

Modifications of the fifth embodiment are described below. After the step shown in FIG. 20, silicon oxide films 100 are formed on the sidewalls and at the bottom of the first trenches 86b by thermal oxidation, for example, as shown in FIG. 28. The silicon oxide films 100 are formed in order to increase diffusion controllability during the formation of the n⁻-type semiconductor regions 81.

Figure 29:
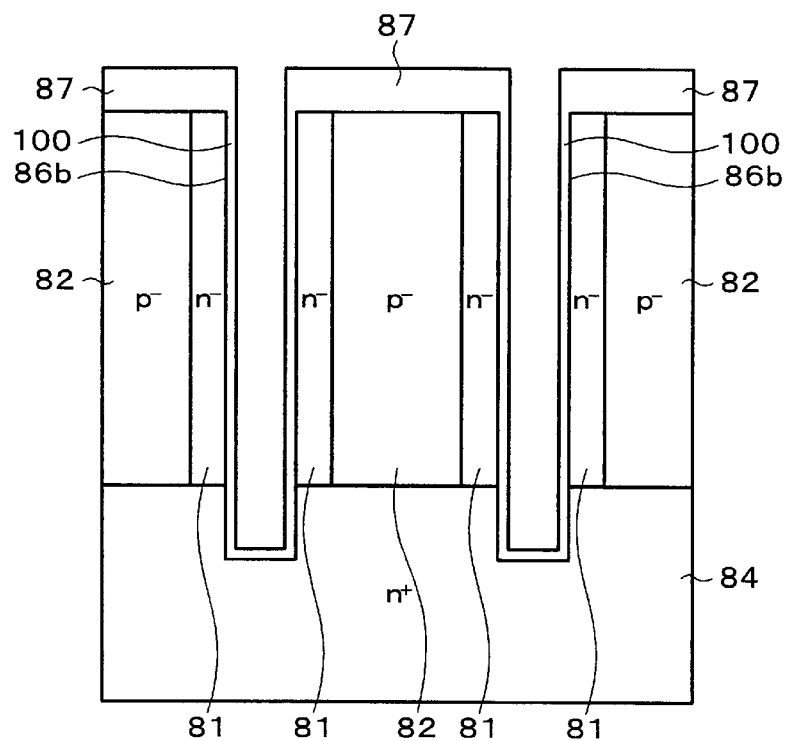
FIG. 29 is a cross-sectional view showing a silicon substrate for illustrating a second step of the modification of the fifth embodiment.

As shown in FIG. 29, n-type impurities are diffused into the p⁻-type silicon layers 85 (FIG. 28) through the silicon oxide films 100 by vapor phase diffusion, thereby forming the n⁻-type semiconductor regions 81 in the p⁻-type silicon layers 85 near the first trenches 86b. Regions of the p⁻-type silicon layer 85 in which n-type impurities are not diffused become the p⁻-type semiconductor regions 82. The step shown in FIG. 22 is then performed. Since the succeeding steps are the same as in the fifth embodiment, further description is omitted.

Figure 30:
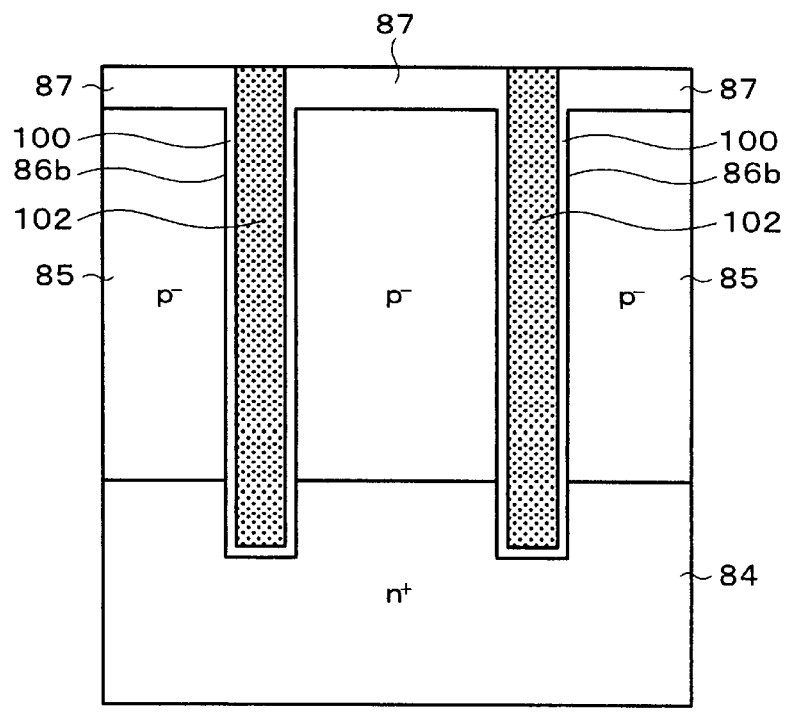
FIG. 30 is a cross-sectional view showing a silicon substrate for illustrating a first step of another modification of the fifth embodiment.

Another modification is described below. After the step shown in FIG. 28, doped polysilicon films 102 are formed so that the first trenches 86b are filled therewith, as shown in FIG. 30. The doped polysilicon films 102 are doped with n-type impurities. The n-type impurities are phosphorus, for example.

Figure 31:
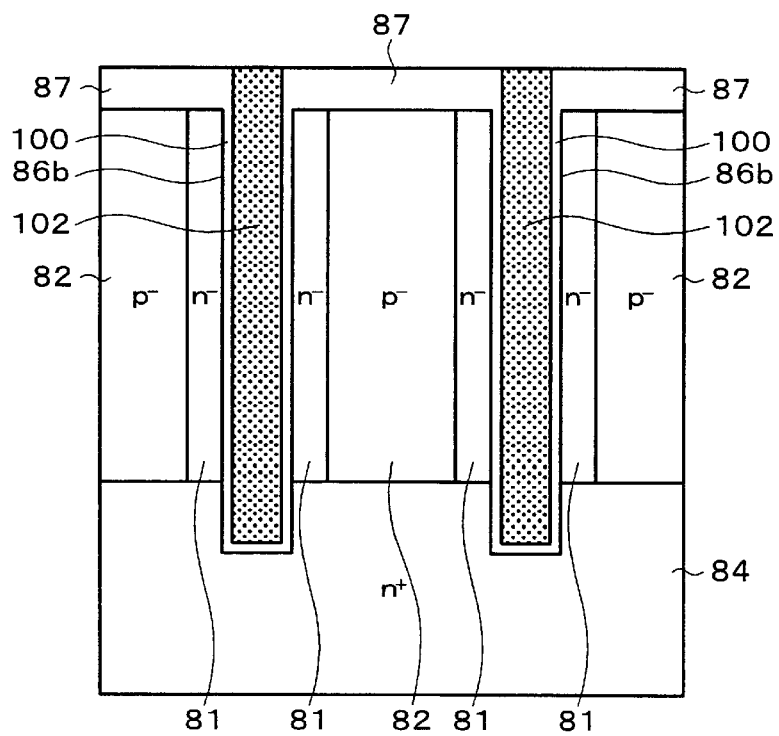
FIG. 31 is a cross-sectional view showing a silicon substrate for illustrating a second step of another modification of the fifth embodiment.

As shown in FIG. 31, the n-type impurities contained in the doped polysilicon films 102 are diffused into the p⁻-type silicon layer 85 (FIG. 30) by solid phase diffusion through the silicon oxide films 100, thereby forming the n⁻-type semiconductor regions 81 in the p⁻-type silicon layers 85 near the first trenches 86b. Regions of the p⁻-type silicon layers 85 in which the n-type impurities are not diffused become the p⁻-type semiconductor regions 82. The doped polysilicon films 102 and the silicon oxide films 100 are removed. The step shown in FIG. 22 is then performed. Since the succeeding steps are the same as in the fifth embodiment, further description is omitted. PSG films may be used as the diffusion source in place of the doped polysilicon films 102. Since the PSG films exhibit insulation properties, it is unnecessary to remove the PSG films after diffusion.

In the above-described modifications, the silicon oxide films 100 are formed on the sidewalls of the first trenches 86b by thermal oxidation in order to improve diffusion controllability. In the case where the thermal oxidation is performed after forming the buried gate electrodes 90, the entire region of the buried gate electrodes 90 may be oxidized. This is because the buried gate electrodes 90, which are formed of polysilicon films containing a high concentration of impurities, are oxidized very easily. In the fifth embodiment, since the buried gate electrodes 90 are formed after the thermal oxidation, oxidation of the buried gate electrodes 90 can be prevented.

Sixth Embodiment

Description of Structure

Figure 32:
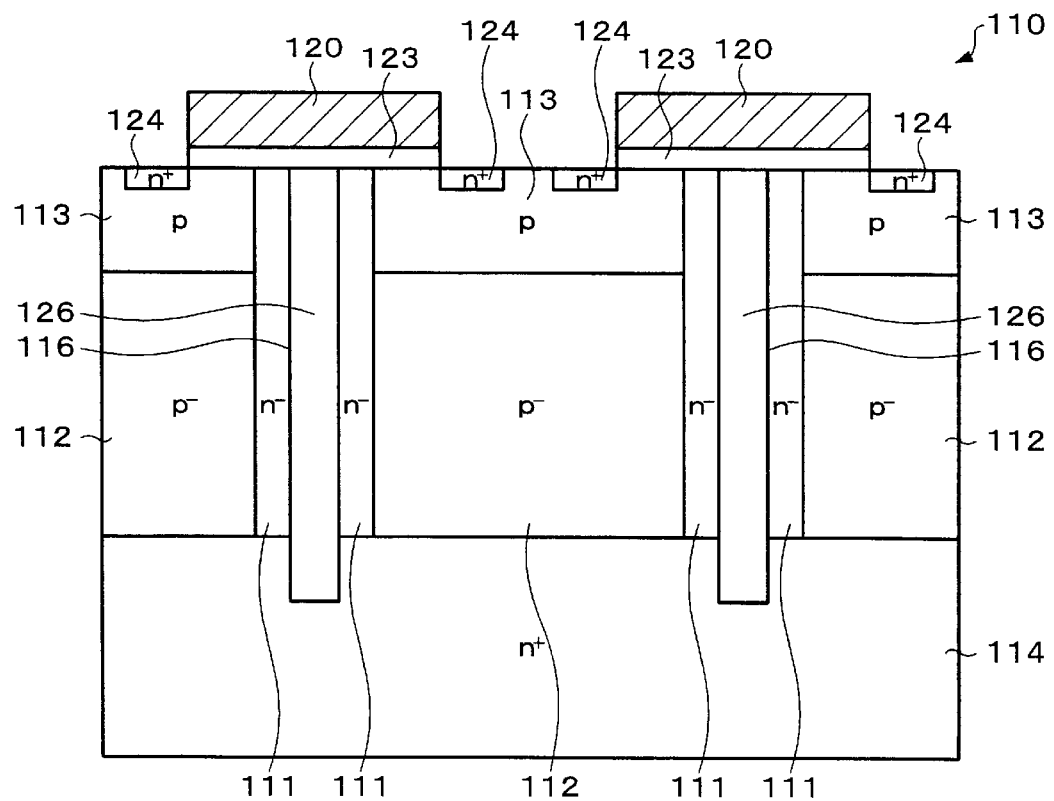
FIG. 32 is a cross-sectional view showing a vertical semiconductor device according to a sixth embodiment.

FIG. 32 is a cross-sectional view showing a vertical semiconductor device according to a sixth embodiment of the present invention. This vertical semiconductor device 110 illustrates a case where the present invention is applied to a planar gate structure. Details of the structure are described below. The vertical semiconductor device 110 includes an n⁺-type drain region 114, a p-type silicon layer 113 which becomes a body region, n⁺-type source regions 124, and gate electrodes 120.

The n⁺-type drain region 114 is formed in a silicon substrate. A structural section in which n⁻-type semiconductor regions 111 and p⁻-type semiconductor regions 112 are arranged alternately is located on the drain region 114. The p-type silicon layers 113 are located on the p⁻-type semiconductor regions 112. A plurality of trenches 116 reaches the drain region 114 through the n⁻-type semiconductor regions 111 so as to remove part of the surface of drain region 114.

The trenches 116 are filled with buried silicon oxide films 126. The n⁺-type source regions 124 are selectively formed on the surface of the p-type silicon layer 113. The planar gate electrodes 120 are formed on the p-type silicon layer 113 through gate oxide films 123.

Description of Manufacture Method

A method of manufacturing the vertical semiconductor device 110 is described below briefly. As specific values for the impurity concentration, diffusion time, and the like, the values described in the above embodiments may be applied. Therefore, further description is omitted.

The steps shown in FIGS. 20 to 23 described in the fifth embodiment are performed. The gate electrodes 120 are formed on the surface of the p-type silicon layer 113 through the gate oxide films 123, as shown in FIG. 32. The gate electrodes 120 may be formed by layering a thermal silicon oxide film and a polysilicon film on the surface of the p-type silicon layer 113 and patterning these films.

The n⁺-type source regions 124 are formed by implantation of n-type ions into the surface of the p-type silicon layer 113 using the gate electrodes 120 as masks. The vertical semiconductor device 110 is completed by these steps.

In the first to sixth embodiments, the n⁻-type semiconductor regions are formed by diffusion. However, the present invention is not limited thereto. The semiconductor regions may be formed as follows. An n⁻-type silicon layer which becomes the n⁻-type semiconductor regions is formed. And p⁻-type semiconductor regions are formed by implantation of p-type impurities into the n⁻-type silicon layer through the sidewalls of trenches formed in the n⁻-type silicon layer.

In the first to sixth embodiments, the structural section has a structure in which the p⁻-type semiconductor regions and the n⁻-type semiconductor regions are arranged alternately. However, the present invention is not limited thereto. The impurity concentration may be either higher or lower than that in the above embodiments.

What is claimed is:

1. A method of manufacturing a high breakdown voltage vertical semiconductor device including a structural section in which a first semiconductor region of first conductivity type and a second semiconductor region of second conductivity type are arranged alternately,
   wherein a breakdown voltage is sustained by the structural section, and
   wherein the method comprises steps of:
   (a) forming a trench in a semiconductor layer of second conductivity type;
   (b) diffusing impurities of first conductivity type into the semiconductor layer through a sidewall of the trench, then forming the first semiconductor region in part of the semiconductor layer and allowing a remaining portion of the semiconductor layer to become the second semiconductor region; and
   forming a thin film on the sidewall of the trench before the step (b) and after the step (a),
   wherein the impurities are diffused into the semiconductor layer through the thin film in the step (b).

2. The method of manufacturing a high breakdown voltage vertical semiconductor device according to claim 1, further comprising:
   a step of forming the semiconductor layer over a third semiconductor region of first conductivity type which becomes a drain, before the step (a),
   wherein in the step (a), the trench is formed so as to reach the third semiconductor region through the semiconductor layer.

3. The method of manufacturing a high breakdown voltage vertical semiconductor device according to claim 1,
   wherein the diffusion comprises vapor phase diffusion in the step (b).

4. The method of manufacturing a high breakdown voltage vertical semiconductor device according to claim 1, further comprising:
   a step of forming a film including the impurities in the trench before the step (b) and after the step (a),
   wherein the impurities are diffused from the film including the impurities by solid phase diffusion in the step (b).

5. The method of manufacturing a high breakdown voltage vertical semiconductor device according to claim 1, further comprising:
   a step of forming a planar gate electrode over an upper surface of the semiconductor layer after the step (b).

6. The method of manufacturing a high breakdown voltage vertical semiconductor device according to claim 1, after the step (b), further comprising:
   a step of forming another trench in the semiconductor layer; and
   a step of forming a buried gate electrode in the another trench.

7. The method of manufacturing a high breakdown voltage vertical semiconductor device according to claim 1, before the step (a), further comprising:
   a step of forming another trench in the semiconductor layer; and
   a step of forming a buried gate electrode in another trench,
   wherein the trench is formed through the buried gate electrode in the step (a).

8. The method of manufacturing a high breakdown voltage vertical semiconductor device according to claim 1, further comprising:
   a step of forming another trench in the semiconductor layer before the step (a),
   wherein a width of the another trench becomes smaller towards a direction of a bottom thereof, and
   wherein the trench is formed from the bottom of the another trench in the step (a).

9. The method of manufacturing a high breakdown voltage vertical semiconductor device according to claim 2, before the step (a), further comprising:
   a step of forming another semiconductor layer of second conductivity type over the semiconductor layer; and
   a step of forming another trench in the another semiconductor layer,
   wherein the trench is continuously formed with the another trench in the step (a) by anisotropically etching the semiconductor layer and the another semiconductor layer using one mask for both the semiconductor layer and the another semiconductor layer.

10. The method of manufacturing a high breakdown voltage vertical semiconductor device according to claim 9, further comprising:
    a step of forming a thin film on the sidewall of the trench before the step (a) and after the step (b),
    wherein the impurities are diffused into the semiconductor layer through the thin film in the step (b).

11. The method of manufacturing a high breakdown voltage vertical semiconductor device according to claim 10, further comprising:
    a step of forming a film containing the impurities in the trench and the another trench after the step of forming the thin film,
    wherein the impurities are diffused from the film containing the impurities by solid phase diffusion in the step (b).

12. The method of manufacturing a high breakdown voltage vertical semiconductor device according to claim 10, after the step (b), further comprising:
    a step of removing the thin film;
    a step of forming another thin film on a sidewall of the trench and the another trench; and
    a step of forming a buried electrode layer in the trench and the another trench.

13. The method of manufacturing a high breakdown voltage vertical semiconductor device according to claim 11, after the step (b), further comprising:
    a step of removing the film containing the impurities and the thin film;
    a step of forming another thin film on a sidewall of the trench and the another trench; and
    a step of forming a buried electrode layer in the trench and the another trench.

14. The method of manufacturing a high breakdown voltage vertical semiconductor device according to claim 1, further comprising:

a step of forming the semiconductor layer over a third semiconductor region of first conductivity type which becomes a drain, before the step (a); and a step of forming a fourth semiconductor region of first conductivity type which becomes a drain in the semiconductor layer, after the step (b).

15. A high breakdown voltage vertical semiconductor device comprising:

a semiconductor substrate;

a structural section in which a first semiconductor region of first conductivity type and a second semiconductor region of second conductivity type are arranged alternately, the structural section being formed on the semiconductor substrate;

a semiconductor layer of second conductivity type being formed on the structural section;

a trench which extends to the semiconductor substrate through the semiconductor layer of second conductivity type and the first semiconductor region;

a buried gate electrode being formed in the trench intervening a gate insulating film;

a third semiconductor region of first conductivity type being formed in the semiconductor substrate; and a fourth semiconductor region of first conductivity type being formed in the semiconductor layer of second conductivity type adjacent to the gate insulating film.

16. The high breakdown voltage vertical semiconductor device according to claim 15, wherein a graded junction is formed between the first semiconductor region of the second semiconductor region; and wherein an impurity profile of first conductivity type in the graded junction is graded along a direction in which the first and second semiconductor regions are arranged alternately.

17. The high breakdown voltage vertical semiconductor device according to claim 16, wherein the distribution of the impurities of first conductivity type in the graded junction decreases toward a junction between the first semiconductor region and the second semiconductor region.

18. The high breakdown voltage vertical semiconductor device according to claim 17, wherein the distribution of the impurities of first conductivity type increases from the junction toward the trench.

19. The high breakdown voltage vertical semiconductor device according to claim 16, wherein the graded junction comprises a one-sided abrupt junction.

20. A high breakdown voltage vertical semiconductor device, comprising:

a semiconductor substrate;

a structural section in which a first semiconductor region of first conductivity type and a second semiconductor region of second conductivity type are arranged alternately, the structural section being formed on the semiconductor substrate;

a semiconductor layer of second conductivity type being formed on the structural section;

a second trench provided in a semiconductor layer of second conductivity type;

a buried gate electrode being formed in the second trench intervening a gate insulating film;

a first trench which extends to the semiconductor substrate through the buried gate electrode, the gate insulating film and the first semiconductor region;

an insulating film being formed in the first trench;

a third semiconductor region of first conductivity type being formed in the semiconductor substrate; and a fourth semiconductor region of first conductivity type being formed in the semiconductor layer of second conductivity type adjacent to the gate insulating film, wherein a graded junction is formed between the first semiconductor region and the second semiconductor region, and wherein an impurity profile of first conductivity type in the graded junction is graded along a direction in which the first and second semiconductor regions are arranged alternately.

21. The high breakdown voltage vertical semiconductor device according to claim 20, wherein the distribution of the impurities of first conductivity type in the graded junction decreases toward a junction between the first semiconductor region and the second semiconductor region.

22. The high breakdown voltage vertical semiconductor device according to claim 21, wherein the distribution of the impurities of first conductivity type increases from the junction toward the first trench.

23. The high breakdown voltage vertical semiconductor device according to claim 20, wherein the graded junction comprises a one-sided abrupt junction.

24. A high breakdown voltage vertical semiconductor device, comprising:

a semiconductor substrate;

a structural section in which a first semiconductor region of first conductivity type and a second semiconductor region of second conductivity type are arranged alternately, the structural section being formed on the semiconductor substrate;

a semiconductor layer of second conductivity type being formed on the structural section;

a first trench which extends to the semiconductor substrate through the first semiconductor region;

an insulating film being formed in the first trench;

a second trench provided in a semiconductor layer of second conductivity type and continues to the first trench, and a width of the second trench becomes smaller towards a direction of a bottom thereof;

a buried gate electrode being formed in the second trench intervening a gate insulating film;

a third semiconductor region of first conductivity type being formed in the semiconductor substrate; and a fourth semiconductor region of first conductivity type being formed in the semiconductor layer of second type adjacent to the gate insulating film, wherein a graded junction is formed between the first semiconductor region and the second semiconductor region, and wherein an impurity profile of first conductivity type in the graded junction is graded along a direction in which the first and second semiconductor regions are arranged alternately.

25. The high breakdown voltage vertical semiconductor device according to claim 24, wherein the distribution of the impurities of first conductivity type in the graded junction decreases toward a junction between the first semiconductor region and the second semiconductor region.

26. The high breakdown voltage vertical semiconductor device according to claim 25, wherein the distribution of the impurities of first conductivity type increases from the junction toward the first trench.

27. The high breakdown voltage vertical semiconductor device according to claim 24, wherein the graded junction comprises a one-sided abrupt junction.

28. A high breakdown voltage vertical semiconductor device comprising:
- a semiconductor substrate;
- a structural section in which a first semiconductor region of first conductivity type and second semiconductor region of second conductivity type are arranged alternately, the structural section being formed on the semiconductor substrate;
- a semiconductor layer of second conductivity type being formed on the structural section;
- a trench which extends to the semiconductor substrate through the semiconductor layer of second conductivity type and the first semiconductor region;
- an insulating film being formed in the trench;
- a gate electrode being formed on the semiconductor layer of second conductivity type intervening a gate insulating film;
- a third semiconductor region of first conductivity type being formed in the semiconductor substrate; and
- a fourth semiconductor region of first conductivity type being formed in the semiconductor layer of second conductivity type adjacent to the gate insulating film,
- wherein a graded junction is formed between the first semiconductor region and the second semiconductor region, and
- wherein an impurity profile of first conductivity type in the graded junction is graded along a direction in which the first and second semiconductor regions are arranged alternately.

* * * * *